(12) United States Patent
Molla et al.

(10) Patent No.: US 10,485,091 B2
(45) Date of Patent: Nov. 19, 2019

(54) MICROELECTRONIC MODULES WITH SINTER-BONDED HEAT DISSIPATION STRUCTURES AND METHODS FOR THE FABRICATION THEREOF

(71) Applicant: NXP USA, INC., Austin, TX (US)

(72) Inventors: Jaynal A. Molla, Gilbert, AZ (US); Lakshminarayan Viswanathan, Phoenix, AZ (US); Elie A. Maalouf, Mesa, AZ (US); Geoffrey Tucker, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/202,638

(22) Filed: Nov. 28, 2018

(65) Prior Publication Data

US 2019/0098743 A1 Mar. 28, 2019

Related U.S. Application Data

(63) Continuation-in-part of application No. 16/135,189, filed on Sep. 19, 2018, which is a continuation of
(Continued)

(51) Int. Cl.
*H05K 1/02* (2006.01)
*H05K 1/18* (2006.01)
(Continued)

(52) U.S. Cl.
CPC ....... *H05K 1/0203* (2013.01); *H01L 23/3677* (2013.01); *H01L 23/3735* (2013.01);
(Continued)

(58) Field of Classification Search
CPC ........... H05K 1/021–0212; H05K 1/09; H05K 1/097; H05K 1/111; H05K 1/142;
(Continued)

(56) References Cited

U.S. PATENT DOCUMENTS

| 4,518,398 A | 5/1985 | Tanaka et al. |
| 5,024,883 A * | 6/1991 | SinghDeo ........... A61F 2/30965 156/89.15 |

(Continued)

FOREIGN PATENT DOCUMENTS

| DE | 102012222416 A1 | 6/2014 |
| EP | 2224794 A1 | 9/2010 |

(Continued)

OTHER PUBLICATIONS

Final Office Action; U.S. Appl. No. 16/135,189; 28 pages; dated Aug. 27, 2019.

*Primary Examiner* — Dion Ferguson
*Assistant Examiner* — Amir A Jalali

(57) ABSTRACT

High thermal performance microelectronic modules containing sinter-bonded heat dissipation structures are provided, as are methods for the fabrication thereof. In various embodiments, the method includes the steps or processes of providing a module substrate, such as a circuit board, including a cavity having metallized sidewalls. A sinter-bonded heat dissipation structure is formed within the cavity. The sintered-bonded heat dissipation structure is formed, at least in part, by inserting a prefabricated thermally-conductive body, such as a metallic (e.g., copper) coin into the cavity. A sinter precursor material (e.g., a metal particle-containing paste) is dispensed or otherwise applied into the cavity and onto surfaces of the prefabricated thermally-conductive body before, after, or concurrent with insertion of the prefabricated thermally-conductive body. The sinter precursor material is then sintered at a maximum processing temperature to produce a sinter bond layer bonding the prefabricated thermally-conductive body to the metallized sidewalls of the module substrate.

20 Claims, 8 Drawing Sheets

Related U.S. Application Data application No. 15/363,671, filed on Nov. 29, 2016, now Pat. No. 10,104,759.

(51) Int. Cl.

| | | |
|---|---|---|
| *H05K 3/32* | (2006.01) | |
| *H05K 7/20* | (2006.01) | |
| *H01L 23/373* | (2006.01) | |
| *H01L 23/427* | (2006.01) | |
| *H01L 23/367* | (2006.01) | |
| *H01L 23/15* | (2006.01) | |
| *H01L 23/13* | (2006.01) | |

(52) U.S. Cl.
CPC ........ *H01L 23/3736* (2013.01); *H01L 23/427* (2013.01); *H05K 1/0204* (2013.01); *H05K 1/0218* (2013.01); *H05K 1/185* (2013.01); *H05K 3/32* (2013.01); *H05K 7/20336* (2013.01); *H01L 23/13* (2013.01); *H01L 23/15* (2013.01); *H01L 2224/48091* (2013.01); *H01L 2224/73265* (2013.01); *H01L 2924/00014* (2013.01); *H05K 1/0207* (2013.01); *H05K 2201/066* (2013.01); *H05K 2201/09845* (2013.01); *H05K 2201/10416* (2013.01); *H05K 2203/049* (2013.01); *H05K 2203/1131* (2013.01)

(58) Field of Classification Search
CPC ...... H05K 1/181; H05K 1/0298; H05K 1/115; H05K 3/0061; H05K 3/32; H05K 3/429; H05K 3/1283–1291; H05K 2201/09772; H05K 2023/1136; H01L 23/4012; H01L 2023/4068
USPC .......................................... 174/252; 361/711
See application file for complete search history.

(56) References Cited

U.S. PATENT DOCUMENTS

| | | | |
|---|---|---|---|
| 5,819,858 A * | 10/1998 | Nechansky | H01L 21/4857 174/252 |
| 6,072,238 A | 6/2000 | Viswanathan et al. | |
| 6,613,413 B1 * | 9/2003 | Japp | H05K 3/38 174/255 |
| 7,821,117 B2 | 10/2010 | Brown et al. | |
| 8,822,036 B1 | 9/2014 | Wereszczak | |
| 9,099,567 B2 | 8/2015 | Viswanathan et al. | |
| 9,312,231 B2 | 4/2016 | Viswanathan | |
| 2004/0212078 A1 | 10/2004 | Lee et al. | |
| 2007/0172990 A1 | 7/2007 | Abdo et al. | |
| 2010/0181105 A1 * | 7/2010 | Hitomi | H01L 21/481 174/266 |
| 2010/0238635 A1 * | 9/2010 | Yang | H05K 1/021 361/748 |
| 2010/0300740 A1 * | 12/2010 | Ichiyanagi | H01G 4/232 174/260 |
| 2011/0024908 A1 * | 2/2011 | Lee | H01L 21/76846 257/751 |
| 2012/0268895 A1 * | 10/2012 | Morelle | H01L 23/373 361/715 |
| 2013/0020709 A1 * | 1/2013 | Huang | H01L 24/16 257/762 |
| 2013/0216848 A1 | 8/2013 | Kalich et al. | |
| 2013/0271992 A1 | 10/2013 | Kim et al. | |
| 2014/0070397 A1 | 3/2014 | Viswanathan et al. | |
| 2015/0115451 A1 * | 4/2015 | Viswanathan | H01L 24/13 257/762 |
| 2015/0306669 A1 | 10/2015 | Guenther et al. | |
| 2016/0007440 A1 * | 1/2016 | Lee | H05K 1/0206 361/712 |
| 2016/0219693 A1 | 7/2016 | Nishimoto et al. | |
| 2016/0336254 A1 * | 11/2016 | Railkar | H01L 23/3736 |
| 2017/0004978 A1 * | 1/2017 | Hwang | C09D 11/52 |
| 2017/0174914 A1 * | 6/2017 | Matsumura | C08K 5/13 |
| 2017/0229963 A1 * | 8/2017 | Zeng | H01F 27/24 |
| 2017/0316879 A1 * | 11/2017 | Kim | H01G 2/14 |
| 2017/0326592 A1 * | 11/2017 | Fiseni | B06B 1/0622 |

FOREIGN PATENT DOCUMENTS

| | | |
|---|---|---|
| EP | 3190613 A1 | 7/2017 |
| WO | WO-2016/035796 A1 | 3/2016 |

* cited by examiner

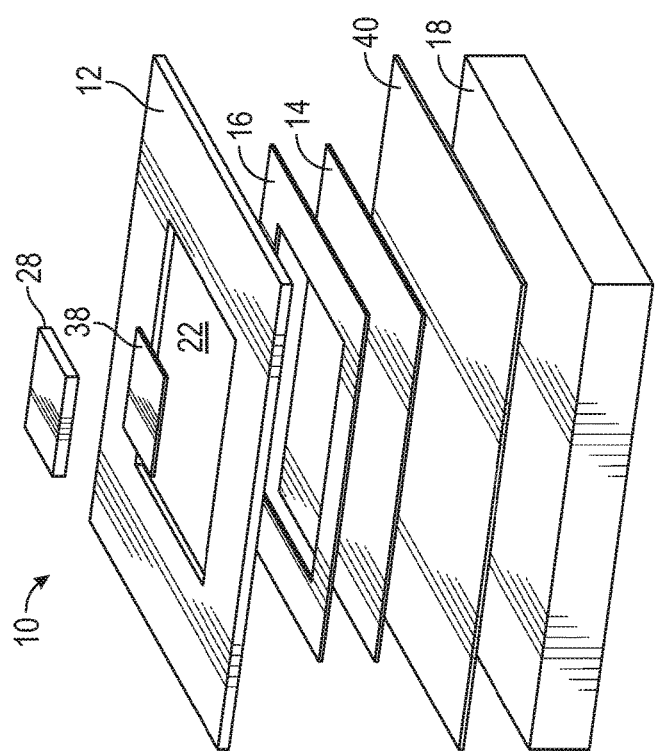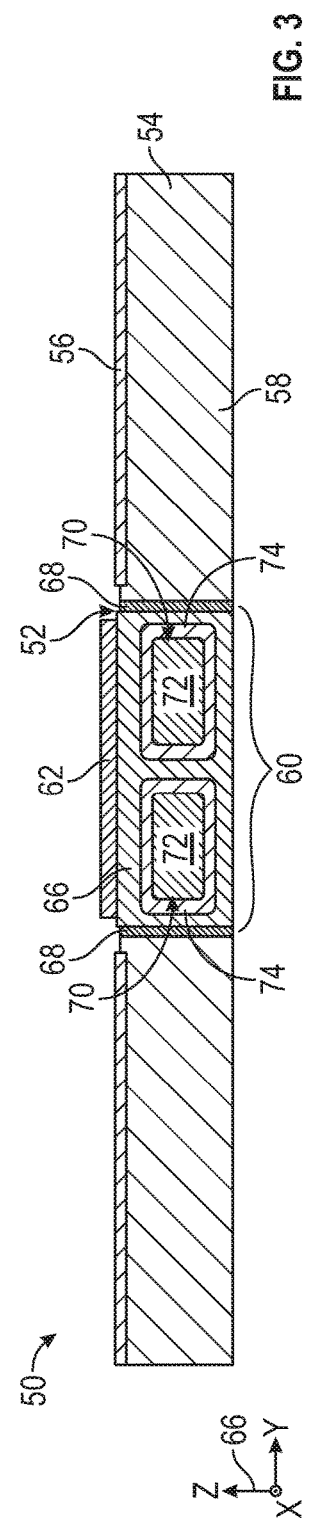

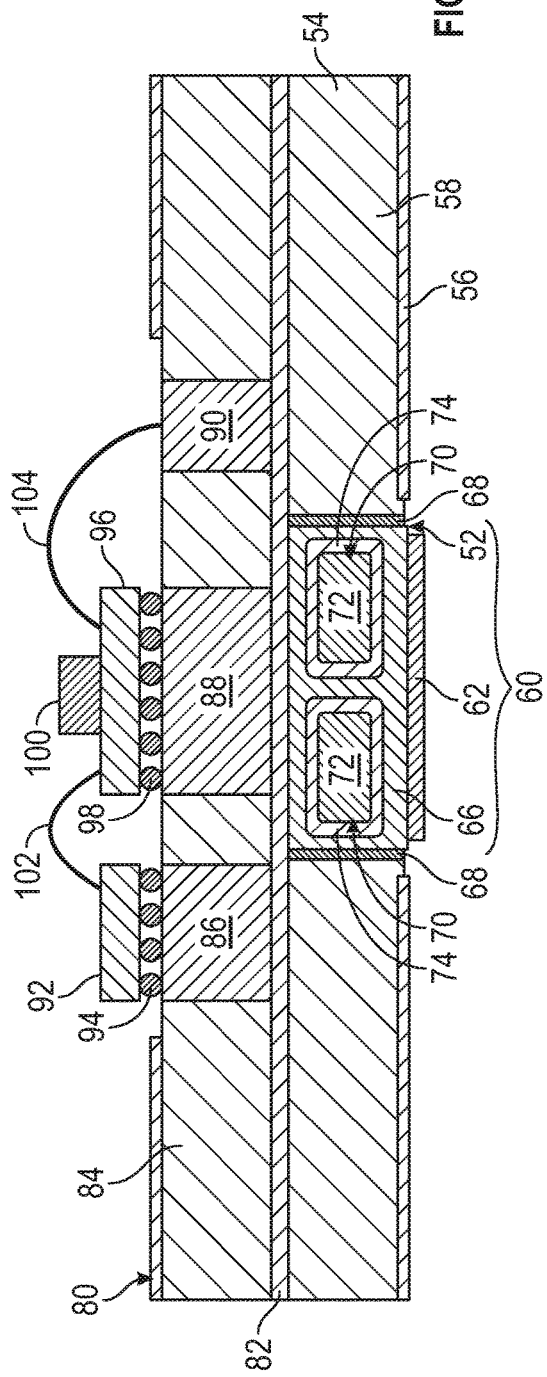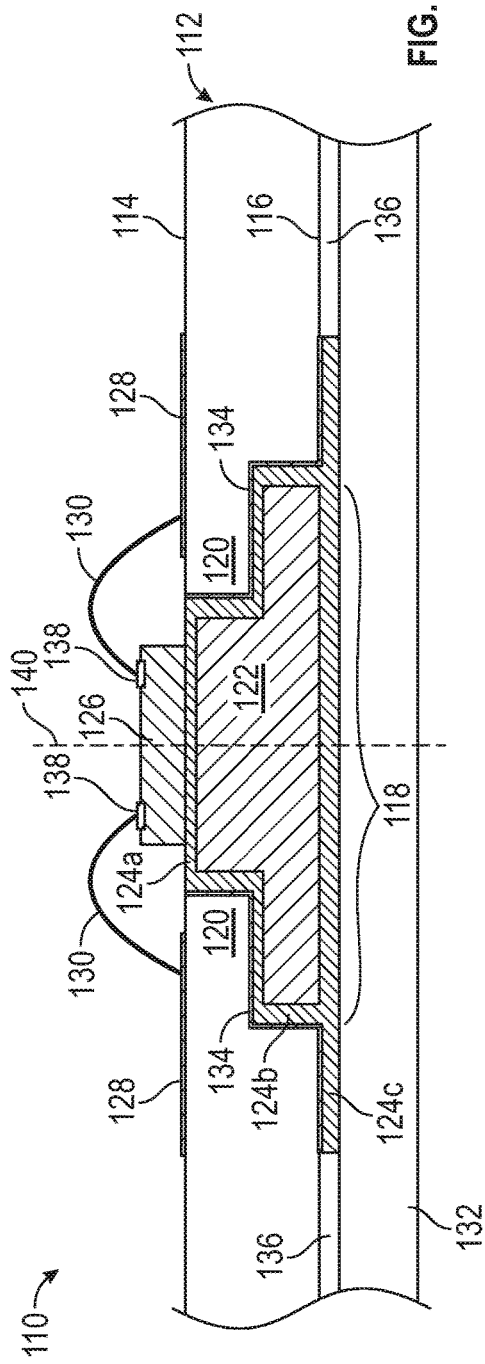

MICROELECTRONIC MODULES WITH SINTER-BONDED HEAT DISSIPATION STRUCTURES AND METHODS FOR THE FABRICATION THEREOF

CROSS-REFERENCE TO RELATED APPLICATIONS

This application is a continuation-in-part of U.S. application Ser. No. 16/135,189, filed with the United Stated Patent and Trademark Office (USPTO) on Sep. 19, 2018; which is, in turn, a continuation of co-pending U.S. application Ser. No. 15/363,671, filed with the USPTO on Nov. 29, 2016.

TECHNICAL FIELD

Embodiments of the present invention relate generally to microelectronic packaging and, more particularly, to high thermal performance microelectronic modules containing sinter-bonded heat dissipation structures, as well as to methods for fabricating such high thermal performance microelectronic modules.

BACKGROUND

Microelectronic modules containing high power microelectronic devices, such as Radio Frequency (RF) semiconductor die, often generate excess heat during operation. For this reason, microelectronic modules are commonly fabricated to contain copper or other metal structures for purposes of enhanced heat dissipation. In certain cases, the metal structures may assume the form of metal structures, such as metal slugs or "coins," embedded within a module substrate, such as a coreless substrate or a Printed Circuit Board (PCB). A metal coin may be embedded in a multilayer PCB in situ by building-up the PCB laminates around the metal coin. Alternatively, a metal structure may be created during production of a coreless substrate utilizing a sequential plating process. As a still further possibility, a metal coin may be installed post module substrate fabrication by, for example, pressing fitting the metal coin into an opening formed through the substrate by mechanical or laser drilling. While module substrates containing embedded metal coins can provide enhanced local heat dissipation, such substrates are often undesirably costly to manufacture, prone to substrate warpage (particularly in the case of coreless substrates), and associated with other shortcomings. More generally, even when produced utilizing embedded coin substrates, microelectronic modules may still experience undesirably high heat concentrations when operated at elevated power levels, such as power levels exceeding 1 watt and possibly approaching or exceeding 5 watts, as may be desirable in certain microwave and RF applications. Accordingly, there exists an ongoing demand for microelectronic modules having enhanced heat dissipation capabilities and which are amenable to fabrication utilizing efficient, cost effective, warpage-resistant manufacturing processes.

BRIEF DESCRIPTION OF THE DRAWINGS

At least one example of the present invention will hereinafter be described in conjunction with the following figures, wherein like numerals denote like elements, and:

FIGS. 1 and 2 are simplified cross-sectional and exploded views, respectively, of a microelectronic module including a sinter-bonded heat dissipation structure embedded within a module substrate, as illustrated in accordance with an exemplary embodiment of the present disclosure;

FIGS. 3 and 4 are simplified cross-sectional and isometric views, respectively, of a microelectronic module containing at least one heat pipe, which is positioned in a substrate cavity and embedded in a sintered metal body, as illustrated in accordance with a further exemplary embodiment of the present disclosure;

FIG. 5 is a simplified cross-sectional view of the microelectronic module shown in FIGS. 3 and 4, as inverted and bonded to a second microelectronic module by a sintered ground plane, as illustrated in accordance with a still further exemplary embodiment of the present disclosure;

FIG. 6 is a simplified cross-sectional view of a microelectronic module including a sinter-bonded heat dissipation structure embedded within a module substrate, as illustrated in accordance with a yet further exemplary embodiment of the present disclosure;

Figure 1:
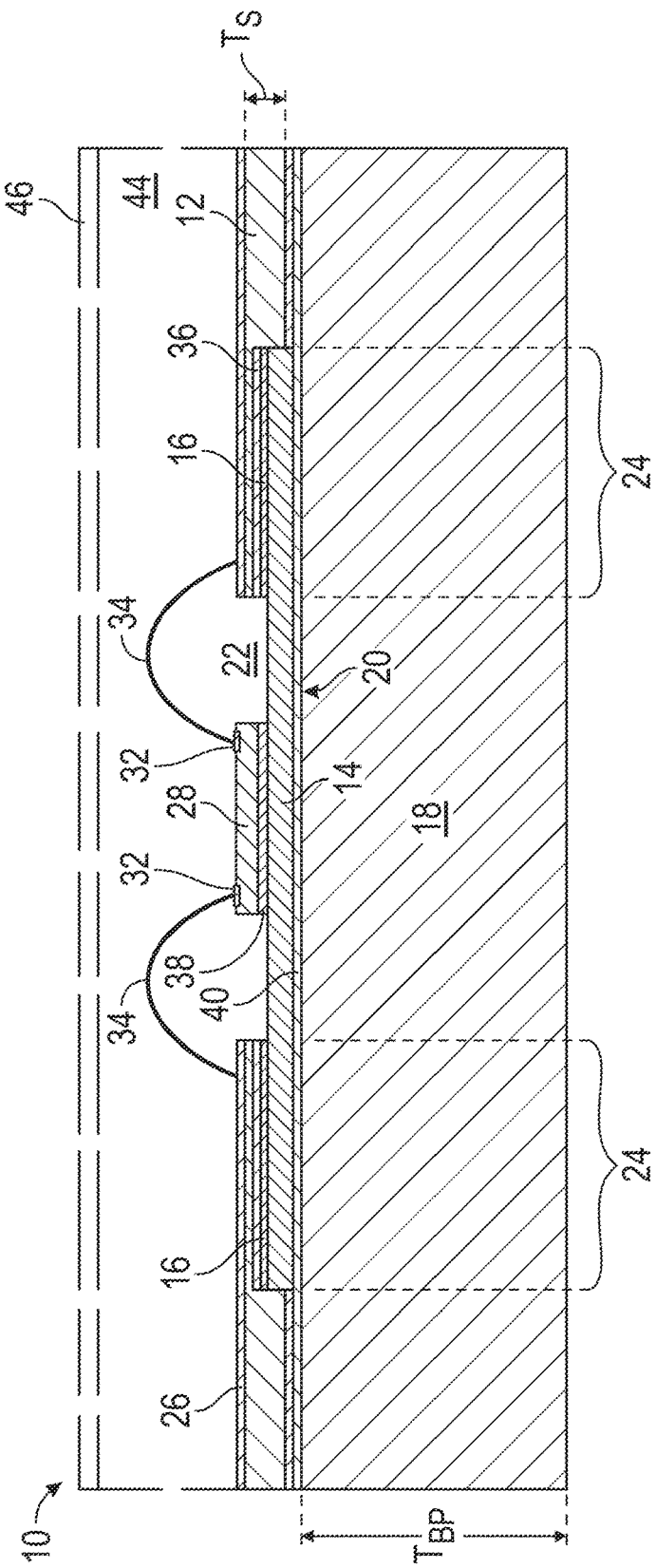

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect. As appearing herein, a structure or body is considered "thermally-conductive" when the structure or body has a thermal conductivity exceeding 5 watts per meter-Kelvin (W/mK). Finally, as further appearing herein, the term "metallic coin" refers to a prefabricated piece or body predominately composed of at least one metal by weight percentage (wt %).

Overview

The following describes high thermal performance microelectronic modules including sinter-bonded heat dissipation structures and methods for producing such microelectronic modules. As indicated by the term "sinter-bonded," the heat dissipation structures are at least partially composed of a sintered material bonded to a module substrate, such as a coreless substrate, a Printed Circuit Board (PCB), or other substrate containing or lacking electrically-conductive routing features. In certain embodiments, the heat dissipation structure may consist substantially entirely of sintered material, which may fill one or more cavities provided in the module substrate. In other embodiments, the heat dissipation structure may contain a thermally-conductive piece (e.g., a metal slug) or an elongated thermal conduit (e.g., a heat pipe), which is affixed within the one or more cavities provided in the substrate by the sintered material. In such embodiments, the heat dissipation structure may thermally couple at least one semiconductor die or other microelectronic device to a heatsink further attached to the substrate, possibly by the sintered material. In this manner, the heat dissipation structure may provide a robust thermal transfer path promoting efficient conduction of heat from the microelectronic device to the heatsink, which may be convectively-cooled by ambient air, by forced airflow, or in another manner. The heat dissipation capabilities of the microelectronic module may be enhanced as a result.

In addition to providing enhanced heat dissipation, multiple benefits may be realized through the strategic usage of sinter material to bond the heat dissipation structure to the module substrate. The sinter material is advantageously formulated to form relatively robust metallurgical bonds with (e.g., metallized) surfaces of a module substrate, such as plated copper (Cu) or other plate metal layers formed on selected substrate surfaces. The sinter material can also be formulated to have a relatively high ductility reducing the likelihood of bond separation or cracking through thermal cycling; to have a controlled (e.g., near zero) porosity; and to have other desirable properties, as tailored by material composition and process parameters. The sintered material can be formed by processing a sinter precursor material utilizing low temperature sintering processes, which are carried-out at limited maximum processing temperatures (e.g., maximum processing temperatures less than 300 degrees Celsius (° C.)) through the application of elevated heat, controlled convergent pressures, or both heat and convergent pressures. As the sintering process is carried-out at relatively low temperatures, material constraints placed on the module components are eased and the above-described issues associated with high temperature processing, such as substrate warpage, are mitigated. Additionally, the sintering process may be leveraged to concurrently sinter bond one or more microelectronic devices and/or a heatsink to the module substrate in conjunction with bonding heat dissipation structure thereto. A highly efficient, cost effective manufacturing process is thus provided for fabricating microelectronic modules, whether in series or in parallel.

In certain embodiments of the microelectronic module, the sinter-bonded heat dissipation structures may serve other functions in addition to providing enhanced thermal transfer away from one or more heat-generating microelectronic devices contained within the module. For example, the sinter-bonded heat dissipation structures may be electrically-active in implementations and serve as electrically-conductive vias, which provide power and/or signal transfer through the module substrate. In embodiments wherein the module substrate assumes the form of a multilayer PCB or a multilayer coreless substrate having one or more internal wiring layers or patterned metal levels, traces or interconnect lines within the wiring layers may electrically contact the sinter-bonded heat dissipation structure. In other embodiments, the sinter-bonded heat dissipation structure may serve as a ground plane and/or may bond the microelectronic module to another structure or device, such as a second microelectronic module. In still further embodiments, the microelectronic module may also be produced to include other sintered structures in addition to the heat dissipation structure, such as sintered Radio Frequency (RF) shield structures. Examples of microelectronic modules having such sintered metal structures and methods for producing such microelectronic modules will now be provided in conjunction with FIGS. 1-6.

EXEMPLARY EMBODIMENTS OF THE PRESENT DISCLOSURE

Turning now to FIG. 1, there is shown a simplified cross-sectional view of a microelectronic module 10, as illustrated accordance with an exemplary embodiment of the present disclosure. Among other components, microelectronic module 10 includes a module substrate 12, a sinter-bonded heat dissipation structure 14, 16, and a heatsink 18, which are bonded in a stacked relationship. Heat dissipation structure 14, 16 is captured between module substrate 12 and heatsink 18. More specifically, heat dissipation structure 14, 16 is contained within a central substrate cavity 20 provided in the underside of a module substrate 12; that is, the lower principal surface of substrate 12 bonded to heatsink 18. A central opening 22 is provided in an upper portion of module substrate 12. Central opening 22 intersects substrate cavity 20 and allows physical access to sinter-bonded heat dissipation structure 14, 16 from the exterior of module substrate 12. The planform dimensions of central opening 22 are less than the planform dimensions of substrate cavity 20 thereby imparting module substrate 12 with an inner peripheral ledge 24, which borders central opening 22 and which partially covers heat dissipation structure 14, 16.

Module substrate 12 can assume any form suitable for serving as a support structure during fabrication of microelectronic module 10 and to which heat dissipation structure 14, 16 can be sinter bonded. Module substrate 12 may or may not contain electrically-conductive routing features. In the illustrated example, module substrate 12 assumes the form of a multilayer substrate, such as a multilayer PCB or a multilayer coreless substrate, including an upper patterned metal layer 26 and at least one internal wiring layer (not shown for clarity). To produce substrate 12 when assuming the form of a multilayer PCB, multiple PCB layers may be successively built-up utilizing a lamination process, with the upper PCB layer (or layers) having a central opening defining module central opening 22 and with the lower PCB layer (or layers) having a larger, central opening defining substrate cavity 20. Alternatively, to produce substrate 12 when assuming the form of a coreless substrate, multiple build-up layers may be successively formed over a non-illustrated carrier or temporary substrate, which is subsequently removed after completion of the build-up process. If desired, such build-up layers can be formed within or around a stiffener, such as a metal or ceramic ring. By producing substrate 12 as a multilayer coreless substrate rather than a multilayer PCB, the thickness of substrate 12 can be reduced. As a tradeoff, coreless substrates are relatively prone to warpage during high temperature processing; however, this is less of a concern in the present context due, at least in part, to the below-described low temperature sintering process. In still further embodiments, module substrate 12 may assume various other forms, including the form of a relatively thin, single layer PCB or coreless substrate lacking internal wiring layers, an interposer, or another dielectric structure including or lacking metal routing features. For example, as a still further possibility, substrate 12 may be produced utilizing a panelization process in which a Redistribution Layer (RDL) structure containing interconnect lines is a produced over a molded panel, which is subsequently singulated into discrete units.

A microelectronic device 28 is mounted to sinter-bonded heat dissipation structure 14, 16 opposite heatsink 18. Microelectronic device 28 can be, for example, a semiconductor die having an active surface on which one or more groups (e.g., rows or clusters) of bond pads 32 are located. In the illustrated example, bond pads 32 are electrically coupled to electrically-conducive traces formed in patterned metal layer 26 by wire bonds 34. In further embodiments, a different electrical interconnection approach can be utilized including, for example, the formation of one or more RDLs containing interconnect lines over device 28 and substrate 12. Furthermore, while including only a single microelectronic device in the embodiment of FIG. 1, microelectronic module 10 can include any practical number of interconnected microelectronic devices in further embodiments, in which case module 10 may be considered a System-in-Package (SiP). A non-exhaustive list of other microelectronic devices that may be contained in microelectronic module 10 includes additional semiconductor die (e.g., memory die or Application Specification Integrated Circuit (ASIC) die), Microelectromechanical Systems (MEMS) devices, and Surface Mount Devices (SMDs), such as discrete or passive capacitors (e.g., chip caps), inductors, resistors, and diodes, to list but a few examples.

Heatsink 18 is composed of a material having a thermal conductivity exceeding that of module substrate 12. Heatsink 18 will often be composed of a metallic material, such as aluminum (Al), Cu, or nickel (Ni), and alloys thereof. However, heatsink 18 can also be produced from certain composite materials and non-metallic materials having relatively high thermal conductivities. Such materials may include, but are not limited to, diamond polycarbonate materials, diamond-metal composites (e.g., diamond Au, diamond Ag, and diamond Cu), pyrolytic graphite, and materials containing allotropes of carbon, such as graphene and carbon nanotube-filled materials. Heatsink 18 is usefully produced to have a material volume greater than that of module substrate 12. In this regard, and as indicated in FIG. 1, heatsink 18 may have a thickness TBP while module substrate 12 has a thickness Ts, as measured along an axis orthogonal to the upper principal surface of heatsink 18. TBP is greater than Ts and may be at least twice Ts in an embodiment. Heatsink 18 may have a substantially monolithic or layered composition. In certain embodiments, heatsink 18 may also include an array of fins, pin-fins, or other surface area-increasing features. In the illustrated embodiment, and by way of non-limiting example only, heatsink 18 assumes the form of a relatively large metal (e.g., Al) block or baseplate.

Sinter-bonded heat dissipation structure 14, 16 has a thermal conductivity greater than substrate 12. Sinter-bonded heat dissipation structure 14, 16 thus functions to conduct excess heat from microelectronic device 28 to heatsink 18. Sinter-bonded heat dissipation structure 14, 16 may have various different structural forms and material compositions suitable for this heat transfer function, providing that at least some fraction of heat dissipation structure 14, 16 is composed of a sintered metallic material of the type described herein. In certain implementations, sinter-bonded heat dissipation structure 14, 16 may be exclusively composed of a sintered metal body, which fills substrate cavity 20 in whole or in part. In other implementations, sinter-bonded heat dissipation structure 14, 16 may contain other thermally-conductive prefabricated pieces or parts, which are positioned in substrate cavity 20 and joined to module substrate 12 by the sintered metal body. For example, in certain embodiments, heat dissipation structure 14, 16 may be produced to contain one or more metal coins, plates, or high thermal conductivity slugs. As appearing herein, the term "high thermal conductivity slug" refers to prefabricated solid body or structure having a thermal conductivity exceeding that of the module substrate, such as module substrate 12 shown in FIG. 1. In the illustrated embodiment of FIG. 1, specifically, sinter-bonded heat dissipation structure 14, 16 includes a high thermal conductivity (TC) coin 14. High TC coin 14 can be composed of a metallic material, a non-metallic material, or a composite material including those materials discussed above in conjunction with heatsink 18. In an embodiment, high TC coin 14 assumes the form of a coin, plate, or block composed predominately or essentially entirely of a metal or alloy, such as Cu; and having a thermal conductivity exceeding that of substrate 12 and possibly of heatsink 18. High TC coin 14 can have a monolithic or layered structure. If desired, one or more surfaces of high TC coin 14 may be plated or clad with another metal or roughened to promote bonding with sintered metal body or layer 16 during the below-described sintering process.

FIG. 2 further illustrates microelectronic module 10 in an exploded view (metallized layer 26, bond pads 32, and wire bonds 34 not shown). Referring jointly to FIGS. 1 and 2, and as shown most clearly in FIG. 2, high TC coin 14 may have a planform shape and dimensions substantially matching those of substrate cavity 20. Stated differently, high TC coin 14 may be shaped and sized for mating reception in substrate cavity 20. Substrate-embedded sinter bond layer 16 also has an outer planform shape and dimensions substantially corresponding with those of substrate cavity 20. Additionally, sinter bond layer 16 is ring-shaped or annular in the illustrated example and includes a central opening having dimensions generally matching those of substrate opening 22. In one embodiment, sinter bond layer 16 may be formed by an annular sinter preform or precut film. Located between substrate 12 and coin 14, substrate-embedded sinter bond layer 16 thus bonds an outer peripheral portion of high TC coin 14 to inner peripheral ledge 24 of module substrate 12. To promote the formation of a robust metallurgical bond, the underside or interior of peripheral ledge 24 may be metallized or plated (e.g., via sputter deposition) to include a metal layer 36, as identified in FIG. 1.

Microelectronic device 28 is bonded to high TC coin 14 by a device bond layer 38. Device bond layer 38 can be composed of a non-sintered material, such as a die attach epoxy, which is deposited onto high TC coin 14 before or after formation of substrate-embedded sinter bond layer 16. However, for reasons of process efficiency, it may be advantageous to form device bond layer 38 from a sintered material, which is similar or substantially identical to that from which substrate-embedded sinter bond layer 16 is composed. In this regard, substrate-embedded sinter bond layer 16 and device bond layer 38 may be formed from a common sinter precursor material, which is applied as a patterned layer (e.g., as an applied film or as a deposited paste layer) over the upper surface of high TC coin 14 and then sintered to concurrently form layers 16, 38. Similarly, heatsink 18 is bonded to module substrate 12 and high TC coin 14 by a heatsink bond layer 40, which is also advantageously (but not necessarily) formed from a sintered material that is similar or identical in composition to the material from which sinter bond layer 16 is formed. For this reason, layers 16, 38, 40 are collectively described below as "sinter bond layers 16, 38, 40." This notwithstanding, it is emphasized that layers 38, 40 may not be formed from a sintered material in further embodiments of microelectronic module 10.

Sinter bond layers 16, 38, 40 are produced from a sinter precursor material, which is densified into a substantially coherent mass or layer during a low temperature sintering process. The particular composition of sinter bond layers 16, 38, 40 will vary amongst embodiments, depending upon the initial formulation of the sinter precursor material and the parameters of the sintering process. Generally, sinter bond layers 16, 38, 40 may be predominately composed of at least one metal, by wt %. In one embodiment, sinter bond layers 16, 38, 40 are each predominately composed of Cu, Ag, Au, or a mixture thereof, again as considered by weight. Sinter bond layers 16, 38, 40 may or may not contain organic materials. In certain implementations, sinter bond layers 16, 38, 40 may be essentially free of organic materials; the term "essentially free," as appearing herein, defined as containing less than 1 wt % of organic materials. In other embodiments, sinter bond layers 16, 38, 40 may contain selected organic materials or fillers to tailor the properties of layers 16, 83, 40. For example, in certain instances, sinter bond layers 16, 38, 40 may contain an epoxy or another organic material. In one implementation, at least sinter bond layer 16 and, possibly, all sinter bond layers 16, 538, 40 are composed of a sintered metal (e.g., Ag) material having a thermal conductivity exceeding 50 W/mK and, perhaps, a thermal conductivity equal to or exceeding about 70 W/mK.

To produce sinter bond layers 16, 38, 40, a sinter precursor material is applied to one or more surfaces of module 10 during module fabrication. With respect to substrate-embedded sinter bond layer 16, in particular, the sinter precursor material may be applied to an outer peripheral portion of high TC coin 14 or to the underside of inner ledge 24 of module substrate 12. With respect to sinter bond layer 38, the sinter precursor material may be applied to high TC coin 14 or to the underside of microelectronic device 28. In one approach, and as indicated above, the sinter precursor material is applied in a patterned layer over the upper surface of high TC coin 14 to form bodies of sinter precursor material that are subsequently transformed into sinter bond layers 16, 38 during the below-described sintering process. Lastly, with respect to sinter bond layer 40, the sinter precursor material may be applied to the underside of module substrate 12, to the underside of high TC coin 14, and/or to the upper surface of heatsink 18 prior to positioning substrate 12 and coin 14 over heatsink 18.

The sinter precursor material can be applied in various different manners including both wet state and dry state application techniques. Suitable wet state application techniques include, but are not limited to, screen or stencil printing, doctor blading, spraying, dipping, and fine needle dispense techniques. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process can be carried-out to remove excess liquid from the sinter precursor material, if so desired.

In further embodiments, the sinter precursor material can be applied utilizing a dry state application technique. For example, a film transfer process can be employed to apply the precursor material to the appropriate component surfaces. In this regard, a dry film may first be prepared by, for example, initially depositing (e.g., screen printing or otherwise dispensing) one or more sinter precursor material onto a temporary substrate or carrier, such as a plastic (e.g., polyethylene terephthalate) tape backing. The sinter precursor material may be applied to the carrier in a wet, flowable state and then heated or otherwise dried to yield a dry film, which is transferred to the appropriate package component surfaces. Heat, pressure, or both heat and pressure are then applied to adhere the metal particle-containing precursor layer (dry film) to the appropriate component surfaces. The carrier (e.g., tape backing) may then be removed by physical removal (e.g., peeling away) or by dissolution in a chemical solvent. This process may then be repeated to apply additional sinter precursor material to other component surfaces, as appropriate. In still further embodiments, one or more freestanding films may simply be positioned between the microelectronic module components during stacking or build-up (also considered "film transfer" in the context of this document).

The metal particles dispersed within the sinter precursor material can have any composition, shape, and size enabling the particles to form a substantially coherent adhesive layer pursuant to the below-described sintering process. In one embodiment, the sinter precursor material contains Au, Ag, or Cu particles, or a mixture thereof. In another embodiment, the metal particles contained within the precursor material consist essentially of Ag or Cu particles. The metal particles contained within the precursor material may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized during the module fabrication process.

The metal particles contained within the precursor material can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns (μm) and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be present within the precursor material. In other implementations, only nanoparticles (that is, particles having average maximum dimension between 1 and 1000 nm) may be contained within the sinter precursor material. As a specific, albeit non-limiting example, the precursor material may contain at least one of Ag, Au, or Cu nanoparticles or micron-sized particles in an embodiment, with Ag or Cu nanoparticles preferred.

As noted above, a low temperature sintering process is performed to produce the desired metal sinter layers after application of the sinter precursor material. The low temperature sintering process can be carried-out under any process conditions suitable for transforming the sinter precursor material into metal sinter layers, noting that some diffusion may occur from the precursor material into contacting components of the microelectronic modules. The sinter bond process thus advantageously forms low stress, mechanically-robust, solid state metallurgical diffusion bonds at the bond joint interfaces. The sintering process may be performed with or without pressure, with or without heating (although some degree of elevated heat will typically be applied), and in any suitable atmosphere (e.g., open air or in the presence of an inert gas, such as nitrogen). As a point of emphasis, the sintering process is carried-out at maximum processing temperatures ($T_{MAX}$) less than the melt point of the metal particles contained within the precursor material. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of Ag, Au, and Cu particles in a nanometer or micron size range will commonly range between approximately 950° C. to 1100° C. To provide a still further example, $T_{MAX}$ may be between approximately 170° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles.

A multistage heating schedule can be employed during the sintering process. In this case, the multistage heating schedule may entail heating microelectronic module 10, in a partially fabricated state, to a first temperature ($T_1$) less than $T_{MAX}$ for a first time period, gradually increasing or ramping-up the temperature process to $T_{MAX}$, and then maintaining $T_{MAX}$ for a second time period. A cool down period may follow. In one embodiment, and by way of non-limiting example only, $T_1$ may range from approximately 100 to 200° C., while $T_{MAX}$ is greater than $T_1$ and ranges from approximately 170 to 280° C. As discussed below, the process parameters employed may or may not be controlled to fully decompose any organic material from the sinter precursor material during the sintering process.

In at least some implementations of the microelectronic module fabrication method, a controlled convergent pressure or compressive force is applied across the partially-fabricated microelectronic modules during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the metal sinter layers, the desired porosity of the metal sinter layers, and the composition of the sinter precursor material. In one embodiment, and by way of non-limiting example only, a maximum pressure (PmAx) ranging between about 0.5 and about 20 megapascal (Mpa) is applied during the sintering process. In other embodiments, PmAx may be greater than or less than the aforementioned range, if pressure is applied during the sintering process.

As previously indicated, the sinter bond layers (e.g., bond layers 16, 38, 40 shown in FIGS. 1 and 2) produced pursuant to the above-described metal sintering process may be composed predominately of one or more sintered metals. Again, the metal sinter layers may or may not contain organic materials. In one embodiment, the metal sinter layers consist essentially of one or more metals (e.g., essentially pure Cu or essentially pure Ag) and are essentially free of organic material (that is, contain less than 1 wt % of organic materials). In other embodiments, the metal sinter layers may contain resin or other organic fillers. For example, in another implementation, the metal sinter layers may contain organic materials that increase pliability, such as an epoxy, to reduce the likelihood of crack formation and propagation across thermal cycles. Depending upon the desired final composition of the metal sinter layers, the parameters of the sintering process may be controlled to decompose organic materials from the sinter precursor material, in whole or in part. Additionally, the metal sinter layers may be produced to have a desired porosity, which may range from 0% to 30% by volume in an embodiment. In another embodiment, the metal sinter layers may be formed to each have a porosity of less than 1% by volume. Finally, the thickness of the metal sinter layers will vary amongst embodiments, but may range between about 5 microns and about 100 microns and, preferably, between about 15 microns and about 35 μm in one exemplary and non-limiting implementation. In another embodiment wherein the metal sinter layers are composed of essentially pure Ag or Cu, the metal sinter layers may have a thickness range from about 40 microns to about 100 microns.

To provide a more specific, albeit non-limiting example of one manufacturing approach, microelectronic module 10 can be produced in the following manner. Commencing the fabrication process, a first layer of sinter precursor material is applied in a continuous layer across the upper surface of heatsink 18. The sinter precursor material may be applied in a wet stat as a paint or paint, which is screen printed over the upper surface of heatsink 18. Alternatively, the sinter precursor material may be applied to the upper surface of heatsink 18 as a dry state (e.g., freestanding) film utilizing a film transfer process of the type described above. High TC coin 14 is then positioned over heatsink 18 utilizing, for example, a pick-and-place tool. A second patterned layer of sinter precursor material is then applied to the upper surface of high TC coin 14 opposite heatsink 18. Again, a dry state or a wet state application technique can be utilized. In one embodiment, a screen printing process (utilizing a patterned screen) or a fine needle dispense (e.g., utilizing a computer-controller print head) is employed. Module substrate 12 and microelectronic device 28 are then each positioned utilizing a pick-and-place tool. If a first heat treatment process was not already performed to transform the first layer of sinter precursor material into sinter bond layer 40, a common heat treatment or sintering process may be carried-out transform the first and second layers of sinter precursor material into sinter bond layers 16, 38, 40, respectively. Wire bonding may then be carried-out to form wire bonds 34 electrically interconnecting microelectronic device 28 and the routing features of module substrate 12. Additional process steps may also be performed, as appropriate, to complete fabrication of microelectronic module 10.

In the above-described manner, microelectronic module 10 is produced to include a module substrate (e.g., substrate 12) and a sinter-bonded heat dissipation structure (e.g., heat dissipation structure 14, 16) in a reliable and cost effective manner. In certain embodiments, a common heat treatment process may be utilized to simultaneously transform the selectively-applied sinter precursor material into sinter bond layers 16, 38, 40. In contrast to other conventional manufacturing processes, machining of heatsink 18 may be avoided. Furthermore, as the above-described sintering process is carried-out at limited maximum temperatures, issues associated with substrate warpage are alleviated. Packaging manufacturing costs may be reduced as a result. Other advantages may also be achieved by virtue of the above-described manufacturing process and module structure. For example, when utilized in an RF application, the relative positioning of heatsink 18 and microelectronic device 28 (e.g., a semiconductor die carrying RF circuitry) may provide relatively effective RF grounding to reduce losses during module operation.

Microelectronic module 10 may include various other structural features in further embodiments. For example, a window frame may be positioned around and a lid may be positioned over substrate 12 to enclose microelectronic device 28 when microelectronic module 10 assumes the form of an air cavity package. Alternatively, an encapsulant body 44 (shown in phantom in FIG. 1) may be formed over substrate 12 and around microelectronic device 28 in an implementation. Microelectronic module 10 may also be produced to include other sintered metal structures, if desired. For example, as further shown in phantom in FIG. 1, a sintered metal RF shield layer 46 may be formed over encapsulant body 44 opposite microelectronic device 28. When present, sintered metal RF shield layer 46 may be formed by depositing a sinter precursor material and then sintering the precursor material in the manner previously described; e.g., in one approach, a mold material is overmolded over substrate 12 and device 28 to form encapsulant body 44, a layer of sinter precursor material is then applied to the uppermost surface of body 44 as a continuous paste layer or transferred film, and a sintering process is then carried-out to transform the layer of sinter precursor material to RF shield layer 46.

Embodiments of a high thermal performance microelectronic module including a sintered heat dissipation structure have thus been described, along with embodiments of a method for producing such a microelectronic module. As noted above, the sintered heat dissipation structure may be embedded in a PCB, a coreless substrate, or other module substrate and may promote conductive heat flow away from one or more heat-generating microelectronic devices (e.g., semiconductor die) supported by heat dissipation structure. The sintered heat transfer structure may conduct heat to a convectively-cooled heatsink, such as a metal plate or pin fin array, further included in the microelectronic module. In embodiments, the sintered heat dissipation structure may consist essentially of a sintered metal body, which is formed in a cavity provided in the module substrate. Alternatively, the sintered heat transfer structure may further include a dedicated thermal conduit or heat spreader positioned in the cavity and bonded to the module substrate by the sintered metal body. In the above-described example, a thermally-conductive piece or part (e.g., high thermal conductivity coin 14) is utilized for this purpose. In further embodiments, the sintered heat dissipation structure may contain one or more elongated heat pipes, which are suspended within a substrate cavity by the sintered material. An exemplary embodiment of a microelectronic module including a sintered heat dissipation structure, which contains one or more dedicated thermal conduits in the form of elongated heat pipes, will now be described in conjunction with FIGS. 3 and 4.

Figure 4:
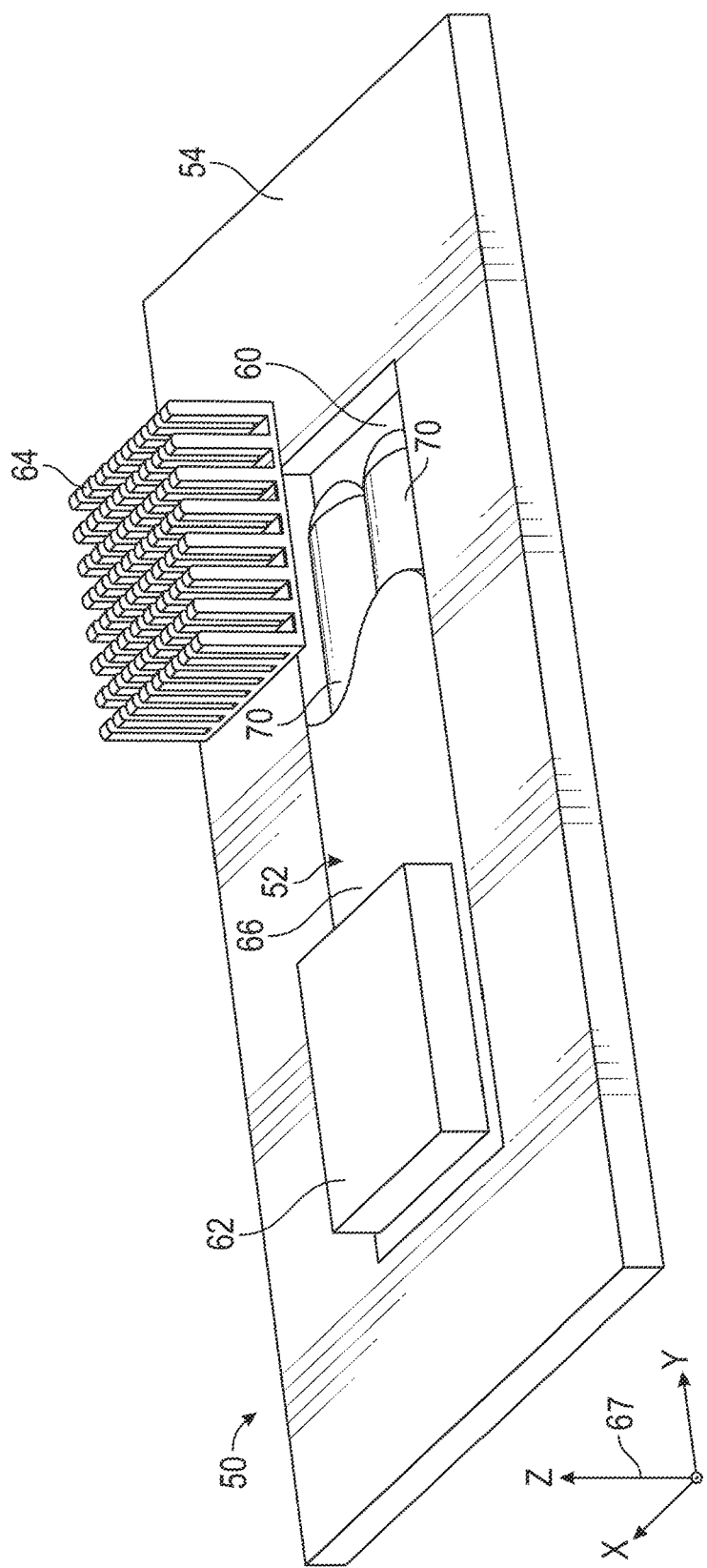

FIGS. 3 and 4 are simplified cross-sectional and isometric views, respectively, of a microelectronic module 50 containing a substrate-embedded, sinter-bonded heat dissipation structure 52, as illustrated in accordance with a further exemplary embodiment of the present disclosure. In this embodiment, microelectronic module 50 includes a module substrate 54 having an upper patterned metal layer 56 (shown in FIG. 3 only). As was the case previously, module substrate 54 can assume the form of a single layer or multilayer PCB, coreless substrate, a substrate including RDLs built-up over a molded body produced utilizing a panelization process, or another type of substrate containing or lacking routing features. Sinter-bonded heat dissipation structure 62 is embedded within module substrate 54 and, specifically, is located within a cavity 60 is provided through a central portion of substrate 54. Sinter-bonded heat dissipation structure 52 supports a microelectronic device 62 (e.g., a semiconductor die) and a heatsink 64 (e.g., a pin-fin array). As shown in FIG. 4, microelectronic device 62 and heatsink 64 are positioned in a side-by-side relationship and laterally spaced along the Y-axis identified by coordinate legend 67. Cavity 60 and sinter-bonded heat dissipation structure 62 are likewise elongated along the Y-axis. Heat dissipation structure 52 thus includes first and second opposing end portions underlying microelectronic device 62 and heatsink 64, respectively.

Sinter-bonded heat dissipation structure 52 contains a sintered metal body 66, which is shown in cross-section in FIG. 3 and in cutaway in FIG. 4. Sintered metal body 66 is bonded to the interior surfaces of module substrate 54 defining substrate cavity 60, which may be metallized (e.g., plated with copper or another metal) to promote bonding, as indicated in FIG. 3 by graphics 68. In one implementation, sintered metal body 66 may fill cavity 60 in its substantial entirety such that heat dissipation structure 62 consists essentially of sintered metal body 66. Alternatively, heat dissipation structure 62 may include one or more dedicated thermal conduits, which are bonded to module substrate 54 by sintered metal body 66 and, perhaps, embedded or buried within body 66. For example, as indicated in FIGS. 3 and 4, one or more elongated heat pipes 70 may be embedded within sintered metal body 66 and may extend along at least the majority of the length of cavity 60. Heat pipes 70 may each assume the form of a hermetically-enclosed pipe or blind tube containing a working fluid (e.g., an ammonia, alcohol, and/or water mixture), which transfers heat from one end of the tube to the other in a thermally efficient manner. The fluid within the heat pipe undergoes a phase change and, specifically, may absorb latent heat and vaporize at the hot interface of the heat pipe (e.g., a first closed end); the vapor phase then flows to the cool interface of the heat pipe (e.g., an opposing closed end) and condenses thereby releasing latent heat; and the liquid phase then returns to the hot interface to complete the heat transfer circuit. As indicated in FIG. 3, heat pipes 70 may contain or be internally lined with a wicking material 72, which promotes flow of the liquid phase from the cold interface to the hot interface via capillary action. Although by no means limited to a particular shape or material, the shell 74 of each heat pipe 70 may assume the form of an elongated, blind tube fabricated from a highly conductive metal or alloy, such as Cu or Al.

By way of non-limiting example, microelectronic module 50 may be produced as follows. First, heat pipes 70 and a sinter precursor material are positioned in substrate cavity 60. In certain embodiments, heat pipes 70 may be first be positioned within substrate cavity 60 and then a wet state sinter precursor material, such as a metal particle-containing paste, may then be dispensed into cavity 60 to fill the remaining free space or voids between heat pipe 70 and the interior surfaces of module substrate 54 defining cavity 60. In other embodiments, heat pipes 70 may be initially embedded in a sinter precursor material (e.g., a powdered sinter precursor material may be pressed around pipes 70) such that the precursor material and heat pipes 70 are jointly positioned in cavity 60. In certain embodiments, the sinter process may then be carried-out to transform the sinter precursor material into metal sinter body 66 and thereby yield substrate-embedded, sinter-bonded heat dissipation structure 52. In this case, microelectronic device 62 and heatsink 64 may be subsequently attached to opposing end portions of heat dissipation structure 52. However, for reasons of process efficiency, it may be desirable to seat microelectronic device 62 and/or heatsink 64 on the sinter precursor material prior to sintering. The sintering process may then be carried-out to form sintered metal body 66, while concurrently bonding microelectronic device 62 and/or heat sink 64 to module substrate 54 through metal body 66. Additional steps may then be performed to complete fabrication of microelectronic module 50, as appropriate, including the formation of electrical interconnections between device 62 and corresponding routing features within module 50; e.g., non-illustrated traces formed over substrate 54.

There has thus been described another exemplary embodiment of a microelectronic module containing a substrate-embedded, sinter bonded heat dissipation structure. In the above-described embodiment, heat transfer from a heat-generating microelectronic device (e.g., a semiconductor die) to a heatsink is enhanced by forming the heat dissipation structure to include one or more dedicated thermal conduits at least partially embedded in a sintered metal body. The thermal conduit or conduits can be elongated strips or rods of a material having a relatively high thermal conductivity, a wire braid or mesh, or the like. Alternatively, the thermal conduit or conduits can be elongated heat pipes, in which case the microelectronic device and the heatsink may be positioned over or adjacent opposing ends of the heat pipes. The thermal conduit or conduits may be positioned within the substrate cavity along with sinter precursor material during fabrication of the module. In one approach, a metal particle-containing paste over and around the thermal conduit to fill, at least in substantial part, one or more voids between the thermal conduit(s) and sidewalls of the substrate defining the substrate opening. A sintering process may then be carried-out to transform the sinter precursor material into a sintered metal body bonding the thermal conduit(s) to the module substrate. By virtue of this and the other process steps described above, a microelectronic module may be produced to include a substrate-embedded, sinter bonded heat dissipation structure, which may significantly enhance the heat dissipation capabilities of the resulting module. In still further embodiments, the sinter bonded heat dissipation structure may perform other functions and/or the resulting module may be bonded to a second module in a stacked configuration. Additional description in this regard will now be provided in conjunction with FIG. 5.

FIG. 5 is a simplified cross-sectional view of microelectronic module 50 (FIGS. 3 and 4), as inverted and bonded to a second microelectronic module 80 by a sintered ground plane 82, as illustrated in accordance with a still further exemplary embodiment of the present disclosure. Microelectronic module 80 contains a module substrate 84, such as a PCB or coreless substrate, having a number of openings or cavities therein. Each substrate cavity is filled with a sintered material to form a plurality of sinter-filled via 86, 88, 90. Microelectronic module 80 further contains three microelectronic devices: (i) a first die 92 having a Ball Grid Array (BGA) 94, (ii) a second die 96 having a BGA 98, and (iii) an SMD 100 stacked onto first die 92. First die 92 is electrically coupled to sintered ground plane 82 through BGA 94 and sinter-filled via 86. Second die 96 is electrically coupled to sintered ground plane 82 through BGA 98 and through sinter-filled via 86. Additionally, one or more wire bonds 104 electrically couple die 94 to sintered ground plane 82 through sinter-filled via 90. Interconnections between first die 92, second die 96, and SMD 100 may be formed utilizing RDL structures containing deposited interconnect lines; through wire bonds, such as wire bond 102 shown between die 92, 96; or in another manner. In certain embodiments, microelectronic device 62 carried by module 50 may also be electrically coupled to ground plane 82 through sintered metal body 66 of heat dissipation structure 52. Sintered ground plane 82 may thus serve the dual purpose of bonding microelectronic modules 50, 80, as well as providing a common ground plane to which devices carried by both modules 50, 80 are electrically connected. Additionally, in a general sense, sintered ground plane 82 may also serve as a heatsink, while sinter-filled via 86, 88 serve as embedded heat dissipation structures providing efficient conductive heat transfer paths from die 92, 96 to ground plane 82, respectively.

Microelectronic module 80 (FIG. 5) may be fabricated utilizing processes similar to those described above. With respect to sinter-filled vas 86, 88, 90, in particular, a sinter precursor material can be applied into the openings or cavities provided through module substrate 84 utilizing a dry or wet state application technique; e.g., a metal particle-containing paste may be dispensed into the substrate cavities by computer-controlled fine needle dispense or by silkscreen application. A low temperature sintering process may then be carried-out to transform the sinter precursor material into sintered metal bodies occupying the cavities and thereby yield sinter-filled via 86, 88, 90. Microelectronic die 92, 96 may be bonded to sintered-filled vias 86, 88 after or concurrent with sintering. In one embodiment, microelectronic die 92, 96 are seated on the deposited sinter precursor material prior to sintering such that the sintering process is leveraged to simultaneous form sinter-filled via 86, 88, 90 and attach die 92, 96 for increased process efficiency. SMD 100 (and possible other microelectronic devices not seen in the cross-sectional view of FIG. 5) may then positioned utilizing a pick-and-place tool. Die 92, 96, SMD 100, and any other microelectronic devices included in module 80 may be subsequently interconnected by, for example, wire bonding. Microelectronic module 80, now in a completed or near completed state, may be bonded to module 50 by formation of sintered ground plane 82. Sintered ground plane 82 may be formed by applying a layer of sinter precursor material (e.g., as a continuous paste layer or film) to the backside surface of microelectronic module 50 or microelectronic module 80; positioning modules 50, 80 in a back-to-back relationship; and then carrying-out a sintering process via application of heat and/or convergent pressure. In further embodiments, sintered ground plane 82 may be formed prior to completion of microelectronic module 50 or microelectronic module 80 such that one module may serve as a substrate over which the other module is fabricated.

FIG. 6 is a cross-sectional view of a microelectronic module 110, as illustrated in accordance with another exemplary embodiment of the present disclosure. In many respects, microelectronic module 110 is similar to microelectronic module 10 described above in conjunction with FIGS. 1 and 2. For example, microelectronic module 110 includes a module substrate 112 having an upper surface 114 and an opposing lower surface 116. Substrate 112 can be, for example, an PCB, a coreless substrate, or a cored substrate predominately composed of organic materials, by volume. A central cavity 118 is provided in module substrate 112 and exposed through lower surface 116. As was previously the case, cavity 118 has a stepped cross-sectional geometry defining an inner peripheral shelf or ledge 120, as considered in a cross-section plane extending orthogonal to upper surface 114. A sinter-bonded heat dissipation structure 122, 124 is embedded within cavity 118 and contains a thermally-conductive body or high TC slug 122 at least partially buried within a sintered metal body 124. Sintered metal body 124 includes an intermediate portion 124(*b*), which bonds high TC slug 122 to the interior surfaces of module substrate 112. Selected surfaces 134 of module substrate 112 defining cavity 118 may be metalized to promote metallurgical bonding between substrate 112 and sintered metal body 124. Sintered metal body 124 also includes an upper portion 124(*a*), which bonds a microelectronic device 126 to substrate 112 through heat dissipation structure 122, 124. Finally, sintered metal body also includes a lower portion 124(*c*) bonding substrate 112 to a heatsink 132. In further embodiments, heatsink 132 may be replaced by different structure or device, such as a second module. If desired, lower portion 124(*c*) of sintered metal body 124 may not extend to the edges of module 110 to provide unfilled air gaps 136 between module substrate 112 and heatsink 132, which may increase the convectively-cooled surface area of heatsink 132 and/or may prevent bridging of any electrical features present on lower surface 116 of substrate 112.

As noted above, sintered metal body 124 bonds or attaches microelectronic device 126 to module substrate 112. Microelectronic device 126 can be, for example, a semiconductor die having bond pads 138, which are electrically interconnected with an upper wiring layer or patterned metal layer 128 provided on substrate 112 utilizing wire bonds 130 or another interconnect approach. As is the case with microelectronic module 10 shown in FIGS. 1 and 2, microelectronic device 126 overlies high TC slug 122, as taken along a centerline 140 of microelectronic module 110. Centerline 140 also intersects both device 126 and slug 122. Sintered metal body 124 and high TC slug 122 each have a thermal conductivity exceeding that of module substrate 112 and collectively provide a highly robust and direct heat transfer path extending from the underside of microelectronic device 126, through upper portion 124(*a*) of sintered metal body 124, through high TC slug 122, through lower portion 124(*c*) of sintered metal body 124, and to heatsink 132. As a compared to microelectronic module 10 (FIGS. 1 and 2), high TC slug 122 has a more complex cross-sectional shape, which increases in width (defined as a dimension perpendicular to centerline 140) with increasing proximity to heatsink 132 and lower surface 116 of module substrate 112, as considered in cross-section plane taken through slug 122. Specifically, in the exemplary embodiment shown in FIG. 6, high TC slug 122 is produced to have a stepped geometry, which generally corresponds with or conforms with the internal geometry of stepped cavity 118. By imparting high TC slug 122 with such a geometry, high TC slug 122 may better spread heat conducted away from device 126 over an upper central portion of heatsink 132. Additionally, such a geometry may increase the cumulative surface area of high TC slug 122 available for bonding. In further embodiments, high TC slug 122 may have a different shape that likewise increases in width with increasing proximity to heatsink 132, such as a trapezoidal cross-sectional geometry.

By way of non-limiting example, one fabrication approach suitable for producing microelectronic module 110 may be carried-out as follows. First, module substrate 112 may be obtained, while interconnected with a number of other substrates in panel form. A number of high thermal conductivity slugs, including high TC slug 122, may be positioned within cavity 118 provided in substrate 112 (FIG. 6) and similar cavities provided in the other non-illustrated substrates. In conjunction with or prior to positioning high TC slug 122 in cavity 118, sinter precursor material may be applied to slug 122 and/or to the interior surfaces of cavity 118 utilizing one or more of the above-described application techniques. The sinter precursor material may be applied to form all portions 124(*a*)-(*c*) of sintered metal body 124 when sintered or, instead, portions 124(*a*)-(*c*) may be applied in different stages or at different steps of the fabrication process. In one embodiment, sinter precursor material is applied to form portion 124(*b*) of sintered metal body 124, low temperature sintering is carried-out to attach high TC slug 122 to module substrate 112, and panel singulation is then performed (e.g., via sawing, laser cutting, scribing with punching, or the like) to separate substrate 112 from the other non-illustrated substrates. Sinter precursor material corresponding to lower portion 124(*c*) of sintered metal body 124 may then be applied, substrate 112 and heatsink 132 may be brought in contact, and a second low temperature sintering process may then be carried-out. Finally, die attach may be performed to mount device 126 over high TC slug 122 by applying sinter precursor material to an upper surface of slug 122, positioning device 126, and then carrying-out a third low temperature sintering process. Various additional steps may then be performed (e.g., ball bonding to form wire bonds 130) to complete fabrication of microelectronic module 110.

In other implementations of the fabrication process utilized to produce microelectronic module 110 (FIG. 6), process efficiency may be boosted by applying and/or thermally processing two or more portions 124(*a*)-(*c*) of sintered metal body 124 in a single step. In either case, the low temperature sintering process is preferably characterized by a maximum process temperature between 175° C. and 300° C. and, more preferably, between 200° C. and 250° C. in an embodiment. In further embodiments, the maximum process temperature during the sintering process may be greater than or less than the aforementioned ranges. Additionally, while shown as containing only wire bonds 130 in the embodiment of FIG. 6, it will be appreciated that microelectronic module 110 can be produced to include various other types of interconnect structures (e.g., plated metal lines) in addition to or in lieu of wire bonds 130 in further embodiments. Generally, then, it should be understood that module 110 and the other microelectronic modules described herein can contain any type and combination of electrically-conductive routing features providing the desired electrical interconnections between the microelectronic device or devices contained within the microelectronic module (e.g., device 126 contained in module 110), the other electrically-conductive routing features (e.g., wiring layers 128 of module 110), and any input/output structure (e.g., a ball grid array, a pin grid array, leads, or the like) that may be further included in embodiments of the above-described microelectronic modules.

Another useful approach for producing high thermal performance microelectronic modules including sintered-bonded heat dissipation structures is set-forth in FIGS. 7-10. As discussed above and more fully below in connection with these drawing figures, the sintered-bonded heat dissipation structure advantageously contains a prefabricated thermally-conductive piece or body, such as a metallic (e.g., Cu) coin or slug, which is positioned in the cavity substrate. A sintered bond layer is further formed in the cavity substrate to secure the prefabricated thermally-conductive body in its desired position, noting that other types of bond layers (e.g., a non-conductive epoxy) can also be disposed within the cavity and bonded to the thermally-conductive body in embodiments. The inner sidewalls of the module substrate defining the cavity (herein, the "cavity sidewalls") may be metallized or plated. So too may plating layers be formed on the upper, lower, and possibly the peripheral surfaces of the prefabricated thermally-conductive body. When metallizing the cavity sidewalls and, perhaps, when further providing metallization or plating on selected surfaces of the thermally-conductive body (e.g., Cu coin), a highly robust metallurgical bond can be formed between the sintered bond layer, the cavity sidewalls, and the thermally-conductive body. In other embodiments, the prefabricated thermally-conductive body may lack such plating layers and, instead, may assume the form of a bare or un-plated metal coin, such as a Cu coin; the term "Cu coin," as appearing, define as a prefabricated metallic body, piece, or structure composed predominately of Cu, by wt %. By way of non-limiting example, further description of such an embodiment will now be provided in conjunction with FIGS. 7-10.

Figure 7:
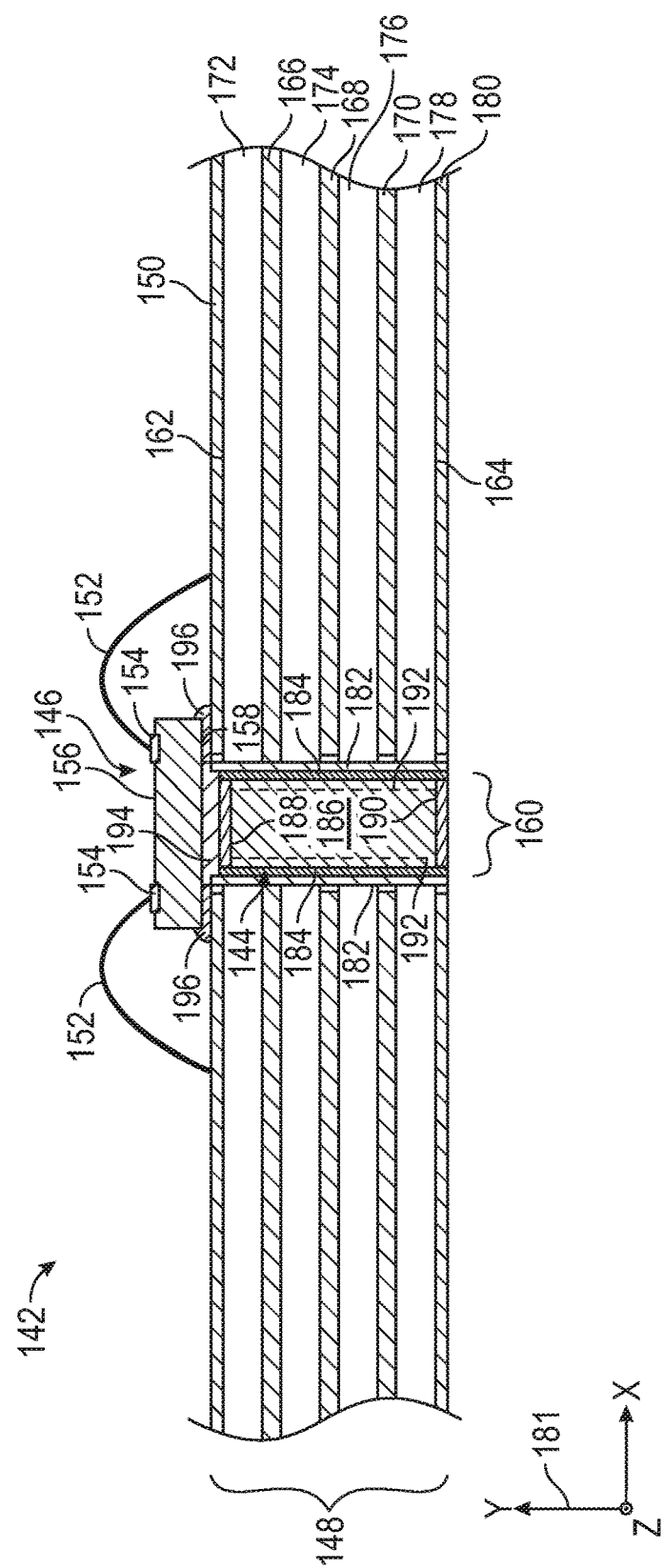
FIG. 7 is a simplified cross-sectional view of a microelectronic module including a sinter-bonded heat dissipation structure embedded within a module substrate, as illustrated in accordance with a still further exemplary embodiment of the present disclosure.

FIG. 7 is a simplified, cross-sectional view of a microelectronic module 142 including a sinter-bonded heat dissipation structure 144, as illustrated in accordance with a yet further exemplary embodiment of the present disclosure. In addition to sinter-bonded heat dissipation structure 144, microelectronic module 142 includes at least one heat-generating microelectronic component 146 attached to a module substrate 148, such as a multilayer PCB. While only a limited portion of module 142 is shown in FIG. 7, the non-illustrated portions of microelectronic module 142 can contain various other features, which are similar to or vary relative to the illustrated features of module 142. For example, the non-illustrated regions of microelectronic module 142 may support other microelectronic components, such as other microelectronic packages (e.g., one or more Power Amplification Modules or "PAMS), passive devices, or bare semiconductor die, which may be interconnected with microelectronic component 146 via the routing features or wiring layers of substrate 148. Additional heat dissipation structures similar or identical to sinter-bonded heat dissipation structure 144 may also be formed in the other, non-illustrated regions of microelectronic module 142, as desired.

Heat-generating microelectronic component 146 can be any microelectronic device or device-containing package, such as a device or package prone to excess heat generation during operation. In certain instances, microelectronic component 146 can be an unpackaged semiconductor die carrying one or more ICs, which provide signal amplification, processing, memory, or RF functionalities, or any combination thereof. Alternatively, microelectronic component 146 can assume the form of a MEMS device, a power transistor die or packaged device, an amplifier, an optical device, a passive device, an inverter switch, an RF antenna structure, or other small scale electronic device susceptible to excess heat generation in at least some instances. As a still further possibility, microelectronic component 146 can be realized as a microelectronic package or module containing one or more RF devices, such as power semiconductor die carrying ICs having RF functionalities. In the embodiment of FIG. 7, specifically, microelectronic component 146 is depicted as a semiconductor die and is consequently referred to hereafter as "semiconductor die 146," again noting that die 146 can be replaced by a different type of microelectronic component in further embodiments.

Semiconductor die 146 may contain or carry various types of ICs, which may be interconnected with electrically-conductive features, such as bond pads and metal traces, in a frontside patterned metal level or layer 150 of substrate 148. For example, and as shown in FIG. 7, wirebonds 152 may complete the desired electrical interconnections between bond pads 154 on die frontside 156 and corresponding bond pads on frontside metal layer 150 (not shown). In other implementations, a different interconnect approach may be employed (e.g., a fan-out approach) or another type of interconnect feature may be utilized, such as three-dimensionally printed traces produced from metallic particle-containing inks. In certain embodiments, semiconductor die 146 may assume the form of a power transistor die or other die bearing RF amplification circuity. In such embodiments, die backside 158 may serve as an electrically-conductive terminal of die 146, such as a ground terminal, which is coupled to electrical ground through sinter-bonded heat dissipation structure 144, as discussed more fully below.

Module substrate 148 can assume any form suitable for supporting heat-generating semiconductor die 146, providing that substrate 148 includes at least one cavity in which sinter-bonded heat dissipation structure 144 can be formed, in whole or in substantial part. The region of substrate 148 shown in FIG. 7 includes one such cavity 160. Here, cavity 160 assumes the form of a fully penetrating through-hole or tunnel, which extends from substrate frontside 162 to substrate backside 164, thereby breaching both frontside 162 and backside 164. In other implementations, cavity 160 may have a different form factor; e.g., cavity 160 can be formed as a blind tunnel extending into substrate 148 from frontside 162 to a predetermined depth, but terminating prior to breaching backside 164. The interior sidewalls of substrate 148 defining cavity 160 may be metallized, in part or in entirety, with a metallic plating layer 182 (exaggerated in FIG. 7 for illustrative clarity). Metallic plating layer 182 may be predominately composed of Cu, by wt %, in certain embodiments; however, in other embodiments, sidewall plating layer 182 may have a different composition or may be omitted from module 142 entirely.

Module substrate 148 may or may not contain electrically-conductive routing features, such as internal wiring layers or metal levels, layer-to-layer electrical connections (e.g., electrically-conductive vias or metal plugs), and other such features for conducting electrical signals, applying voltages, and the like. In the embodiment shown in FIG. 7, substrate 148 assumes the form of a multilayer PCB. As noted above, a first patterned metal layer 150 is provided along substrate frontside 162 and defines traces, pads, and similar electrically-conductive features in electrical communication with semiconductor die 146 and, perhaps, other microelectronic components contained within module 142. Further, in this example, three internal wiring layers or patterned metal levels 166, 168, 170 are further contained in substrate 148 and interspersed with four dielectric layers 172, 174, 176, 178. In other embodiments, substrate 148 may have a greater or lesser number of layers; or may assume a different form, such as that of a coreless substrate or an interposer including or lacking routing features. Substrate 148 may or may not have backside metallization; that is, traces formed along backside 164, as shown in FIG. 7 at 180.

The planform dimensions and shape of cavity 160 (that is, the cavity dimensions and shape as viewed along the Y-axis identified by coordinate legend 181 or in a plane parallel to the X-Z plane) may vary amongst embodiments. In many cases, cavity 160 will have planform dimensions (e.g., width or diameter) less than those of semiconductor die 146. Cavity 160 will often have a rectangular planform geometry when viewed from a top-down or planform perspective. However, in other embodiments, through-substrate cavity 160 may have an ovular, racetrack, circular, or other planform shape. Sinter-bonded heat dissipation structure 144 occupies cavity 160 and may fill cavity 160, in whole or in part, in embodiments of microelectronic module 142. In this manner, and as discussed more fully below, sinter-bonded heat dissipation structure 144 can provide a robust thermal conduction path extending from substrate frontside 162 (or from the semiconductor die 146 if recessed within substrate 148) to and, perhaps, beyond substrate backside 164.

Sinter-bonded heat dissipation structure 144 contains at least one body of sintered material, hereafter "sinter bond layer 184." Sinter bond layer 184 is advantageously formulated to be predominately composed of at least one sintered metal, by wt %. In this regard, sinter bond layer 184 may be predominately composed and, perhaps, consist essentially of Cu, Ag, Au, or a mixture thereof by wt %, in at least some embodiments. In such embodiments, sinter bond layer 184 may or may not contain organic materials. For example, in certain implementations, sinter bond layer 184 may be essentially free of organic materials; the term "essentially free," as appearing herein, defined as containing less than 1 wt % of organic materials. In other embodiments, sinter bond layer 184 may contain selected organic materials or fillers to tailor the properties of bond layer 184, as appropriate to suit a particular application or design purpose. As a more specific example, sinter bond layer 184 may contain an epoxy or another organic material added to increase layer strength. When predominately composed of sintered materials as described herein, sinter bond layer 184 may possess a thermal conductivity exceeding about 35 W/mK, more preferably exceeding about 50 W/mK, and still more preferably exceeding about 70 W/mK. Examples of sintering processes suitable for producing sinter bond layer 184 during fabrication of microelectronic module 142 are further described below in conjunction with FIGS. 8-9.

Sinter-bonded heat dissipation structure 144 usefully, but non-essentially further contains at least prefabricated thermally-conductive body 186, such as a high TC slug or coin. When present, prefabricated thermally-conductive body 186 may be composed of a metallic material, a non-metallic material, or a composite material. Suitable metallic materials include Al, Cu, and Ni, as well as alloys thereof. Suitable non-metallic materials and composites include diamond polycarbonate materials, diamond-metal composites (e.g., diamond Au, diamond Ag, and diamond Cu), pyrolytic graphite, and materials containing allotropes of carbon, such as graphene and carbon nanotube-filled materials. Prefabricated thermally-conductive body 186 can have a non-monolithic constructive, such as a layered construction. For example, in this latter case, prefabricated thermally-conductive body 186 can be fabricated to contain one or more metal (e.g., Cu) layers interspersed with other metallic layers, such as molybdenum (Mo) or a copper-molybdenum (Cu—Mo) alloy layers, having a CTE less than that of the Cu layer(s). In this manner, the effective CTE of prefabricated thermally-conductive body 186 can be more closely matched to substrate 148, to heat-generating semiconductor die 146, and/or to another portion of microelectronic module 142. In other embodiments, prefabricated thermally-conductive body 186 assumes the form of a metallic coin; that is, a plate or block composed predominately or essentially entirely of a metal or alloy, such as Cu, by wt %.

When viewed in three dimensions, prefabricated thermally-conductive body 186 will often have a relatively simple, block-like geometry in embodiments of microelectronic module 142. In other instances, prefabricated thermally-conductive body 186 may have a more complex geometry including geometries characterized by T-shaped, U-shaped, and pyramidal profiles, as viewed along the Y-X plane and/or Y-Z plane of coordinate legend 181. Generally, prefabricated thermally-conductive body 186 is usefully selected to have a planform geometry (shape and dimensions) substantially conforming with the planform geometry of cavity 160, while providing a relatively small circumferential gap between an outer periphery of prefabricated thermally-conductive body 186 and the inner periphery of cavity 160. Prefabricated thermally-conductive body 186 will often be dimensioned or sized to occupy the volumetric majority of cavity 160; however, this is not necessary in all embodiments, noting that multiple thermal conduit members can be positioned in a single tunnel in alternative of microelectronic module 142. The length of prefabricated thermally-conductive body 186, as measured along a vertical axis orthogonal to substrate frontside 162 (corresponding to the Y-axis of legend 181) may be at least half the thickness of substrate 148 (measured along the vertical axis); and, in many instances, the length of prefabricated thermally-conductive body 186 may approach or exceed the substrate thickness, depending upon whether the opposing ends of thermally-conductive body 186 are desirably coplanar with substrate frontside 162 and substrate backside 164, are recessed relative thereto, or protrude from either or both of frontside 162 and backside 164 by a desired amount.

Prefabricate thermally-conductive body 186 (e.g., a metallic coin) thus includes an upper end portion and a lower end portion opposite the upper end portion; the terms "upper" and "lower" defined relative to the proximity of these surfaces to die 146 and substrate frontside 162. Additionally, thermally-conductive body 186 includes an intermediate portion between the upper end portion and the lower end portion. Sinter bond layer 184 contacts an outer peripheral surface of the intermediate portion of thermally-conductive body 186; and, when viewed in three dimensions, sinter bond layer 184 may assume the form of a tubular body extending entirely around or circumscribing prefabricate thermally-conductive body 186. In this manner, sinter bond layer 184 secures prefabricate thermally-conductive body 186 in its desired position within cavity 160. In other embodiments, sinter bond layer 186 may not extend entirely around prefabricate thermally-conductive body 186 and/or any number of additional bond layers (e.g., non-sintered bond layers) may be formed in cavity 160 in addition to sinter bond layer 186.

If desired, one or more surfaces of prefabricated thermally-conductive body 186 may be clad or coated with a material (e.g., a metal plating) to promote bonding with sinter bond layer 184 during the below-described sintering process. For example, as indicated in FIG. 7, prefabricated thermally-conductive body 186 may include either or both of: (i) an upper plating layer 188 formed over or on the upper end of thermally-conductive body 186, and (ii) a lower plating layer 190 formed over or on the lower end of thermally-conductive body 186. Similarly, as indicates in FIG. 7 by dashed lines 192, additional plating layers can optionally be formed over the outer peripheral sidewalls of prefabricated thermally-conductive body 186. Any of plating layers 188, 190, 192 may be composed of various different metals capable of being electrodeposited or otherwise plated over prefabricated thermally-conductive body 186. A non-exhaustive list of such materials includes Cu, Au, Ag, NiPdAu, ENIG (electroless nickel immersion gold), and ENIPIG (electroless nickel electroless palladium immersion gold). As previously noted, the cavity sidewalls defining cavity 160 are also usefully metallized; e.g., as shown in FIG. 7, a plating layer 182 may be formed on the cavity sidewalls and, perhaps, may have a ring-like or tubular structure (when viewed along the Y-axis of legend 181) extending around prefabricated thermally-conductive body 186.

In certain embodiments, prefabricated thermally-conductive body 186 may include upper and lower plating layers 188, 190, while the sidewalls of thermally-conductive body 186 may remain un-plated. In such embodiments, prefabricated thermally-conductive body 186 may be produced along with a number of like thermally-conductive bodies by singulation (e.g., via stamping, water jetting, laser cutting, mechanical sawing, photoetching, or the like) of a relatively large metallic sheet. Prior to singulation, the opposing principal surfaces or faces of the sheet may be plated to define plating layers 188, 190 shown in FIG. 7. In other instances, prefabricated thermally-conductive body 186 can be fabricated in another manner, again noting that thermally-conductive body 186 may lack any or all of plating layers 188, 190, 192 in alternative embodiments. For example, in further embodiments, prefabricated thermally-conductive body 186 may assume the form of a bare block or piece of metal (e.g., Cu) in certain instances. If desired, the sidewalls of thermally-conductive body 186 may be intentionally roughened to promote bonding with sinter bond layer 184.

As indicated in FIG. 7, the lower end of prefabricated thermally-conductive body 186 or lower plating layer 190 (when provided) may be substantially coplanar with backside 164 of module substrate 148. Alternatively, the lower end of thermally-conductive body 186 or plating layer 190 may protrude beyond or be recessed with respect to substrate backside 164 by a desired amount. Similarly, the upper end of prefabricated thermally-conductive body 186 or upper plating layer 188 (when present) may be recessed with respect to, coplanar with, or may project beyond frontside 162 of substrate 148. In the illustrated embodiment, the upper terminal end of thermally-conductive body 186 and frontside plating layer 188 are depicted as recessed with respect to frontside 162 of substrate 148. In this instance, the material or materials (herein, "component bond layer" 194, 196) utilized to attach semiconductor die 146 to module substrate 148 may fill this recess, as shown. In other embodiments, such a recess may not be filled by component bond layer" 194, 196, semiconductor die 146 (or another microelectronic component) may be recessed within substrate 148 by some extent; e.g., as may be case when thermally-conductive body 186 has planform dimensions (that is, dimensions in the X-Z plane of coordinate legend 181) exceeding the footprint of die 146 in a manner similar to that shown in FIG. 1.

As just stated, a component bond layer 194, 196 attaches semiconductor die 146 to module substrate 148. Specifically, in the embodiment of FIG. 7, component bond layer 194, 196 is shown as including an inner, central portion 194 bonding a central portion of die 146 to the upper end of sinter-bonded heat dissipation structure 144; and as further including an outer peripheral portion 196 bonding an outer peripheral portion of die backside 158 to frontside 162 of substrate 148 at a location surrounding the mouth of cavity 160. Bond layer portions 194, 196 may be composed of the same or different materials, depending upon the particular manufacturing approach utilized to fabricate microelectronic module 142. Generally, the material or materials utilized to form component bond layer 194, 196 are ideally selected to provide a direct path between die backside 158 and sinter-bonded heat dissipation structure 144 having a relatively high thermal conductivity and, when an electrical connection is formed between die 146 and heat dissipation structure 144, a relatively high electrical conductivity. In this regard, at least central portion 194 of component bond layer 194, 196, if not the entirety of bond layer 194, 196, may be composed of a sintered material of the type described herein and, perhaps, may have a similar or identical composition to sinter bond layer 184. In one embodiment, central portion 194 of component bond layer 194, 196 is formed from a first material (e.g., a sinter material, solder, or thermally-conductive die attach material) having a first thermal conductivity, while outer peripheral portion 196 of bond layer 194, 196 is composed of a second material a second thermal conductivity less than the first thermal conductivity. In still other embodiments, portions 194, 196 of component bond layer 194, 196 may be composed of the same material and, perhaps, concurrently formed during fabrication of microelectronic module 142.

Sinter-bonded heat dissipation structure 144 is advantageously, although non-essentially utilized to electrically interconnect one or more terminals of semiconductor die 146 to other electrically-active features or devices contained within microelectronic module 142. This may be beneficial when, for example, semiconductor die 146 carries circuitry, such as RF circuitry, that is desirably grounded in a relatively robust and direct manner. Similarly, such a construction may be desirable when die 146 is replaced by a PAM package or other microelectronic component benefiting from electrical grounding. To this end, and as indicated in FIG. 7, sinter-bonded heat dissipation structure 144 may provide an electrically-conductive path from die backside 158; through central portion 194 of component bond layer 194, 196; to an internal wiring layer or other electrically-active feature contained within module substrate 148 utilized for grounding purposes. In one embodiment, the internal wiring layer located closest semiconductor die 146 (i.e., wiring layer 166) as taken along an axis orthogonal to substrate frontside 162 (corresponding to the Y-axis of coordinate legend 181) is an RF grounding layer such that sinter-bonded heat dissipation structure 144 provides a relatively robust (large volume) and direct electrical path from semiconductor die 146 to RF ground layer 166. A robust RF grounding scheme is thereby created within microelectronic module 142, which can be fabricated in a relatively straightforward and cost-effective manner; e.g., without requiring the formation of additional vias. An exemplary process for fabricating microelectronic module 142 will now be described in conjunction with FIGS. 8-10.

Figure 8:
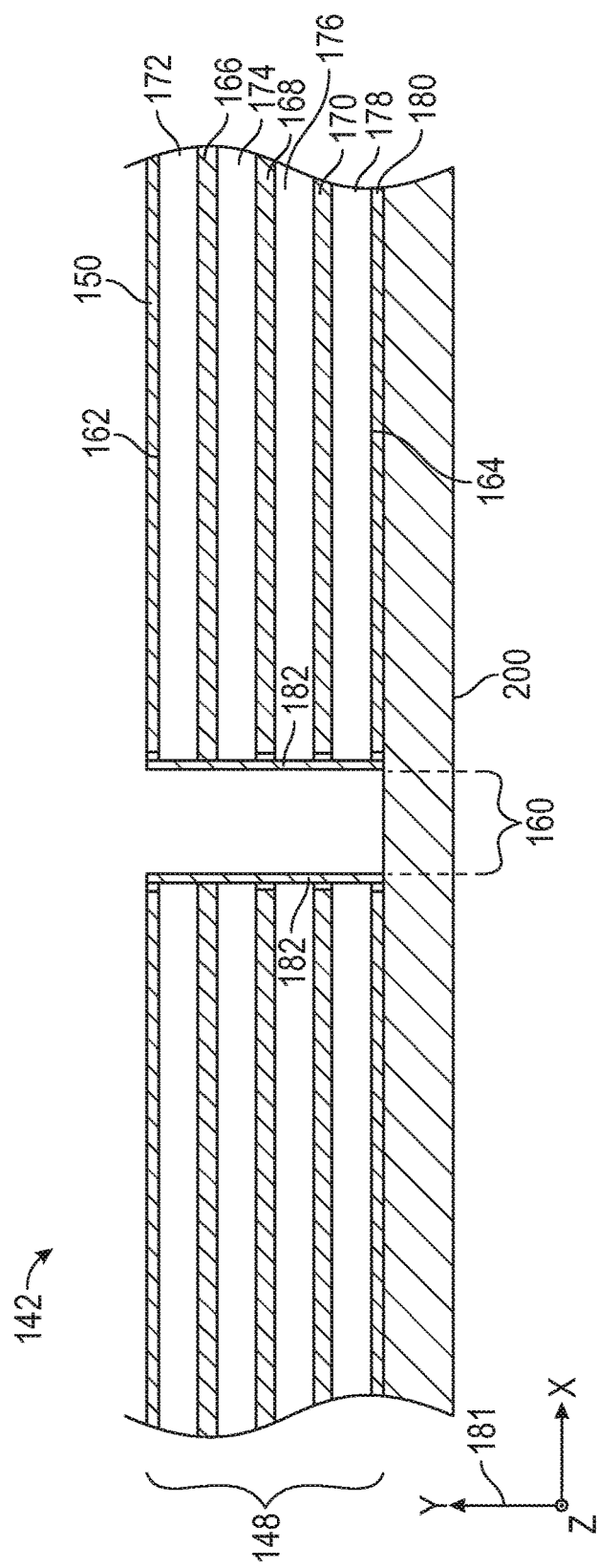
FIGS. 8-10 are cross-sectional views of the microelectronic module shown in FIG. 7 shown at various stages of manufacture, as illustrated in accordance with an exemplary fabrication technique.
Figure 9:
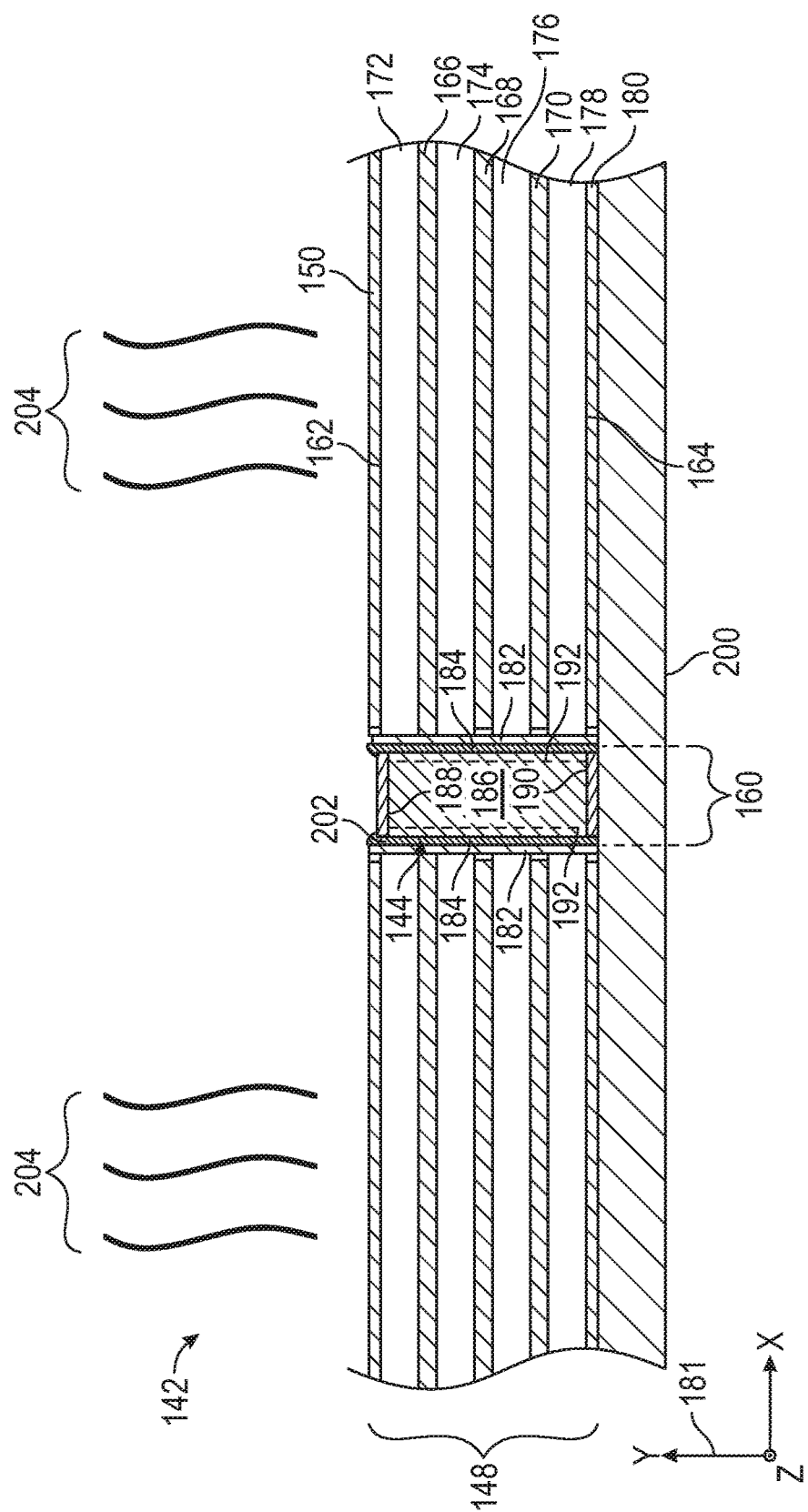
Figure 10:
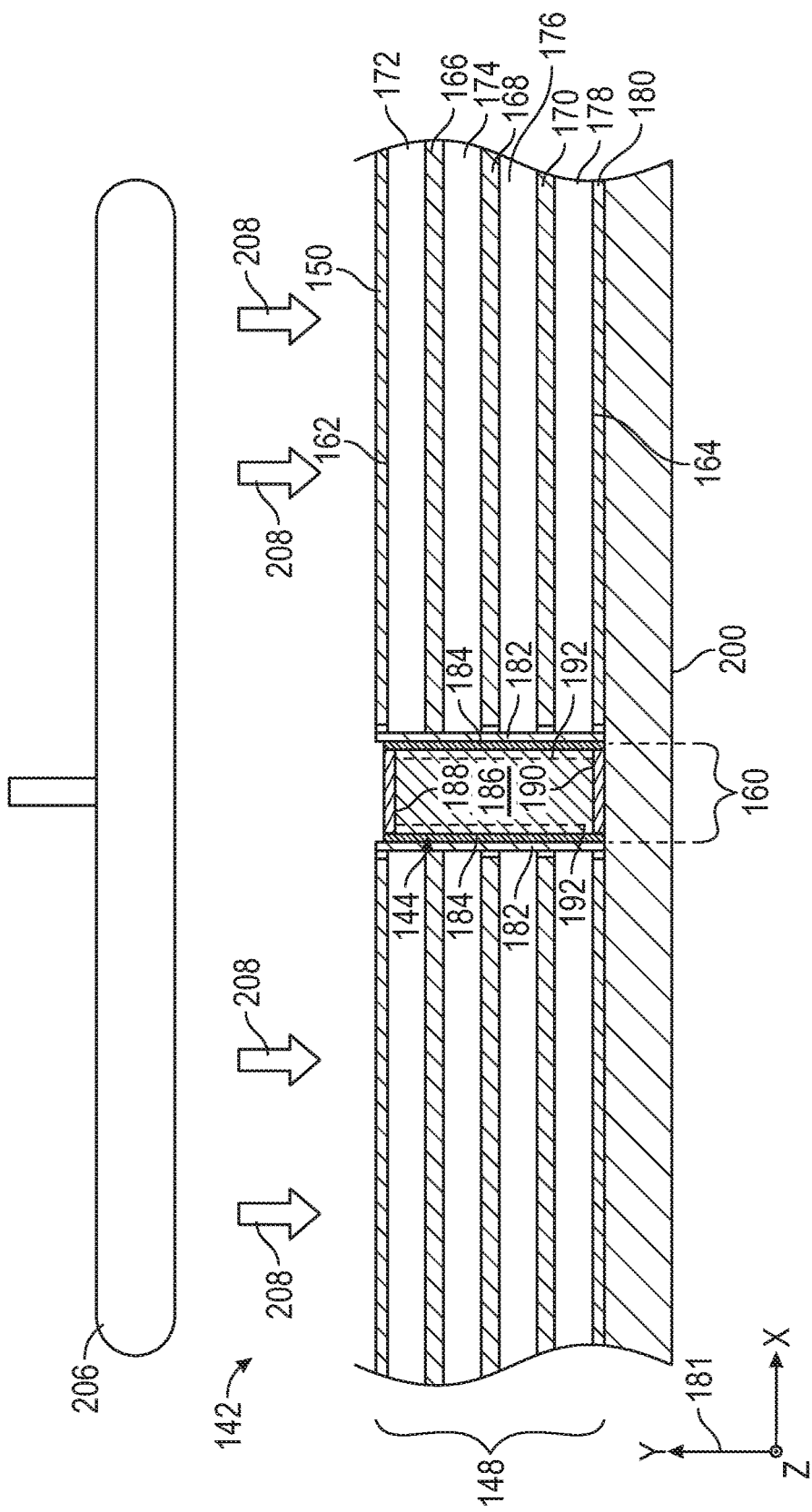

FIGS. 8-10 are cross-sectional views of microelectronic module 142, as depicted at various stages of manufacture and illustrated in accordance with an exemplary fabrication technique. With initial reference to FIG. 8, manufacture of microelectronic module 142 commences with the provision of module substrate 148. Module substrate 148 may be provided by independent fabrication or may be acquired from a third party supplier. In certain cases, module substrate 148 may be purchased in a substantially completed state; or, instead, may lack certain features, which may be subsequently produced. For example, in certain cases, upper patterned metal level 150 not be present at this juncture in the manufacturing process and may be following the planarization or lapping step described below in connection with FIG. 10. Similarly, module substrate 148 may be obtained without the provision of cavity 160, in which case cavity 160 may be created utilizing a suitable (e.g., mechanical or laser drilling) process. In other instances, module substrate 148 may be obtained in a near complete state including upper patterned metal level 150 and cavity 160, as shown. Module substrate 148 is attached to a temporary carrier or support film 200 for subsequent processing. When cavity 160 fully penetrates through module substrate 148, the lower end of cavity 160 may be covered or enclosed by film 200.

Progressing to FIG. 9, prefabricated thermally-conductive body 186 is next inserted into cavity 160 utilizing, for example, a pick-and-place tool. A sinter precursor material 202, which is processed to form sinter bond layer 184 (FIG. 7), is further applied into cavity 160 before, after, or concurrent with positioning of thermally-conductive body 186 in cavity 160. Sinter precursor material 202 is conveniently applied as a metal particle-containing paste utilizing an appropriate dispense technique, such as a computer-controlled fine needle dispense process. In other embodiments, sinter precursor material 202 may be applied utilizing another technique or may be applied in another form, such as a powder, a compressed powder preform, or a solid film. Whether provided as a paste or in another form, sinter precursor material 202 can be applied into cavity 160 prior to insertion of prefabricated thermally-conductive body 186; can be applied onto to selected surfaces of prefabricated thermally-conductive body 186 such that, when thermally-conductive body 186 is positioned within cavity 160, sinter precursor material 202 is concurrently delivered or applied into cavity 160; and/or sinter precursor material 202 can be applied into cavity 160 after insertion of thermally-conductive body 186. In this latter regard, sinter precursor material 202 can be applied into the circumferential gap between the outer periphery of thermally-conductive body 186 and the metallized inner periphery of cavity 160 defined by the cavity sidewalls utilizing, for example, a backfill process. The structure shown in FIG. 9 results.

Sinter precursor material 202 can be produced in accordance with any of the formulations described above. In one embodiment, sinter precursor material 202 contains Au, Ag, or Cu particles, or a mixture thereof. In another embodiment, the metal particles contained within precursor material 202 consist essentially of Ag or Cu particles. The metal particles contained within precursor material 202 may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the microelectronic system fabrication process.

The metal particles contained within sinter precursor material 202 can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 μm and about 10 nm in an embodiment. In other embodiments, the metal particles may have average maximum dimensions greater than or less than the aforementioned range. In certain implementations, a mixture of metal particles having average maximum dimensions in both the nanometer and micron range may be present within the precursor material. In other implementations, only nanoparticles (that is, particles having average maximum dimensions between 1 and 1000 nm) may be contained within sinter precursor material 202. As a specific, albeit non-limiting example, precursor material 202 may contain at least one of Ag, Au, or Cu nanoparticles and/or micron-sized particles in an embodiment, with Ag or Cu nanoparticles preferred. In one specific, albeit non-limiting embodiment, sinter precursor material 202 is applied as a sinter paste containing a mixture of nano-sized and micron-sized metal (e.g., Ag) particles. The particle mixtures is combined with organic materials, such as a dispersant, a binder, and a thinner, to yield a flowable paste possessing the desired viscosity.

Following coin insertion and application of sinter precursor material 202, sintering may be carried-out to transform precursor material 202 into sinter bond layer 184 (FIG. 7). As noted above, peak processing temperatures are beneficially maintained below a peak processing temperature ($T_{MAX}$) during sintering. In many cases, $T_{MAX}$ will also be significantly less than the melt point of the metal particles contained within precursor material 202 and, perhaps, less than one half the melt point of the particles considered on an absolute temperature scale (in Kelvin). In still further embodiments, $T_{MAX}$ may vary during the sintering process, providing that $T_{MAX}$ (in conjunction with the other process parameters) is sufficient to induce sintering of the metal particles without liquefaction. The above-described, low temperature sintering process can be carried-out under any process conditions suitable for transforming precursor material 202 into sinter bond layer 184. The sintering process may be performed with or without pressure, with or without heating (although some degree of elevated heat will typically be applied), and in any suitable atmosphere (e.g., open air or in the presence of an inert gas, such as nitrogen). Heat lines 204, as shown in FIG. 9, are representative of the sintering process conducted at this juncture of the manufacturing process.

During the sintering process, which may involve peak processing temperature ($T_{MAX}$) of approximately 300° C. or lower, some fraction of the organic components of the paste are thermally decomposed or burned-out. In this regard, a multistage heat treatment schedule, including an initial organic burnout step, may be followed during sintering. By way of non-limiting example only, the following heat treatment schedule may be followed: (i) an initial temperature ramp-up phase may involve gradual heating to a first elevated temperature ($T_1$) (e.g., between 125° C. and 225° C.) in a first time period (e.g., between 15 and 90 minutes), (ii) a first thermal soak phase may then be conducted to burn-out a fraction of the organic materials within the paste by maintaining $T_1$ (or a temperature near $T_1$) for a second time period (e.g., between 3 and 60 minutes), and (iii) an optional second temperature ramp-up phase may be performed to a second elevated temperature ($T_2$) exceeding $T_1$ (e.g., between 175° C. and 250° C.), with $T_2$ then maintained for a second thermal soak period in some embodiments. The multistage heating schedule may then conclude with a cool down period. Heating may be conducted in an oven having a controlled (e.g., nitrogen-based) atmosphere. In other implementations, another atmosphere (e.g., an open air environment) may be employed and/or a different heating schedule may be followed.

When produced pursuant to the above-described metal sintering process, sinter bond layer 184 may be predominately composed of one or more sintered metals. Again, the sinter bond layer(s) may or may not contain organic materials. In one embodiment, sinter bond layer 184 may consist essentially of one or more metals (e.g., essentially pure Cu or essentially pure Ag) and are essentially free of organic material; that is, contain less than 1 wt % of organic materials. In other embodiments, sinter bond layer 184 may contain resin or other organic fillers. For example, in another implementation, sinter bond layer 184 may contain organic materials that increase pliability, such as an epoxy, to reduce the likelihood of crack formation and propagation across thermal cycles. In one embodiment, the formulation of sinter precursor material 202 and the parameters of sintering process are such that a polymer resin remains in sinter bond layer 184 (FIG. 7), predominately in the porous network thereof, following sintering. Advantageously, such a polymer resin can improve the mechanical strength and fatigue life of the resulting bond layer. Finally, and as was previously the case, sinter bond layer 184 may be produced to have a desired porosity, which may range from 0% to 30% by volume in an embodiment. In another embodiment, the sinter bond layer may be formed to have a porosity of less than 1% by volume.

Addressing lastly FIG. 10, microelectronic module 142 is shown following the above-described sintering process. If desired, a planarization or lapping process may be conducted, as indicated by lapping tool 206 and arrows 208. Planarization may be performed post sintering, when for example, frontside metal level 150 has not yet been formed over substrate 148. In such embodiments, planarization may be conducted to planarize frontside 162 of substrate 148 and, perhaps, to remove any excess sinter material or overburden potentially encroached onto substrate frontside 162. A final plating process may then be conducted to produce upper patterned metal level 150 and, if so desired, to form upper plating layer 188 of prefabricated thermally-conductive body 186. In other embodiments, patterned metal level 150 may be a pre-existing feature, in which case planarization and additional plating steps may not performed.

Next, and as previously described, semiconductor die 147 is attached to module substrate 148 at a location overlying heat dissipation structure 144. In one embodiment, central portion 194 of component bond layer 194, 196 may be produced from a sintered material similar or identical to sinter bond layer 184, while outer peripheral portion 196 may be produced from a different material (e.g., a solder) having a lower thermal conductivity than does the sintered material. This notwithstanding, it is generally desirable for at least central portion 194 (FIG. 7) of component bond layer 194, 196 to be composed of a material having a relatively high thermal conductivity; and, when it is desired to provide an electrical connection between die backside 158 and heat dissipation structure 144, a relatively high electrical conductivity. This stated, it is also possible that a non-conductive epoxy or similar material may be utilized to help secure prefabricated thermally-conductive body 186 and/or semiconductor die 146 to substrate 148, in which case a plating layer can potentially be formed over such a non-conductive epoxy prior to attachment of die 146. In other embodiments, a different die attachment approach may be employed. After this, die interconnection is carried-out; e.g., via the formation of wirebonds 152. Finally, and if not already performed, module substrate 148 may be singulated to yield the completed structure shown in FIG. 7. Film 200 may also be stripped away or otherwise removed; noting that the provision of film and the above-described process may advantageously provide a substantially coplanar relationship between the lower end of prefabricated thermally-conductive body 186 and substrate backside 164, as shown in FIG. 7 and described above.

Conclusion

There has thus been provided cost efficient manufacturing processes for producing high thermal performance microelectronic modules including sintered metal structures. In embodiments, the microelectronic module includes at least one sinter-bonded heat dissipation structure embedded within a module substrate, such as a PCB, a coreless substrate, a substrate containing an RDL structure, or another substrate including or lacking routing features. During modulate operation, the sinter-bonded heat dissipation structure promotes conductive heat flow away from one or more heat-generating microelectronic devices (e.g., semiconductor die) supported by the substrate. The sinter-bonded heat dissipation structure contains a sintered metal body, which at least partially fills a cavity provided in the substrate. In certain embodiments, the sinter-bonded heat dissipation structure may consist, in its entirety or substantial entirety, of the sintered metal body. In other embodiments, the sinter-bonded heat dissipation structure may further include a thermally-conductive body, such as a metal (e.g., Cu) slug or a heat pipe, bonded to the substrate by the sintered metal body. During module operation, the sinter-bonded heat dissipation structure may conduct heat to a convectively-cooled heatsink, such as a metal plate or pin fin array, further included in the microelectronic module. The heatsink can be attached to the substrate opposite the microelectronic device (or devices) supported by the substrate, bonded to the substrate in a side-by-side relationship with the microelectronic device supported by the substrate, or otherwise positioned in the microelectronic module. The thermal performance of the microelectronic module may be appreciably enhanced through the provision of such a heatsink and substrate-embedded, sinter-bonded heat dissipation structure. Additionally, in some implementations, the sinter-bonded heat dissipation structure may also serve as an electrically-active structure, such as a conducive via providing signal or power transfer to the substrate and, perhaps, to different wiring layers contained within the substrate.

As indicated above, the sintered heat dissipation structure may contain or may consist essentially of a sintered metal body. In an embodiment, the sintered metal body is formed by first applying a sinter precursor material to selected regions of microelectronic module and into the substrate cavity. The sinter precursor material is then transformed into the sinter material utilizing a low temperature sintering process, which is carried-out at limited maximum processing temperatures (e.g., maximum processing temperatures less than 300° C.) through the application of elevated heat, controlled convergent pressures, or both heat and convergent pressures. Prior to sintering, the sinter precursor material may be applied to selected regions of the microelectronic module by, for example, thin film transfer, screen printing, or utilizing another application technique. The sinter precursor material contains one or more types of metal particles, such as Ag, Cu, or Au metal particles, which are bonded and densified during the sintering process. The resulting sintered metal body can be produced with little to no voiding, with a controlled porosity, and to include or lack organic materials. In an embodiment, the sintered metal body is predominately composed of and perhaps consist essentially of a metallic material, such as a sintered silver; and/or has a thermal conductivity exceeding 50 W/mK. As the sintering process is carried-out at relatively low temperatures, material constraints placed on the package components are eased and the above-described issues associated with high temperature processing (e.g., substrate warpage) are mitigated. Production costs may be favorably lowered as a result. Additional sintered metal structures or layers may also be produced utilizing a similar approach. For example, in certain embodiments, a sintered RF shield structures may be formed. In one embodiment, the microelectronic module may include two sub-modules bonded in a stacked or vertically-integrated relationship by a sinter bond layer, which can potentially be leveraged for usage as a ground plane, if so desired.

In one implementation, the above-described module fabrication method includes the step or process of embedding a sinter-bonded heat dissipation structure in a module substrate at least in by: (i) applying a sinter precursor material containing metal particles into a cavity provided in the module substrate, and (ii) sintering the sinter precursor material at a maximum processing temperature less than a melt point of the metal particles to produce a sintered metal body bonded to the module substrate. A microelectronic device and a heatsink are then attached to the module substrate before, after, or concurrent with sintering such that the heatsink is thermally coupled to the microelectronic device through the sinter-bonded heat dissipation structure; e.g., the most direct and efficient thermal conduction path between the device and the heat sink may be through the heat dissipation structure. In certain embodiments, the microelectronic device may be bonded to the module substrate at a location overlying the thermally-conductive structure, as taken along an axis substantially orthogonal to an upper principal surface of the module substrate. In such embodiments, the microelectronic device may be placed in contact with the sinter precursor material such that, after sintering of the sinter precursor material, the sintered metal body bonds the microelectronic device to the module substrate.

In another embodiment, the method includes the step or process of positioning a microelectronic device over a module substrate having a cavity therein. Prior to positioning the microelectronic device over the module substrate, a sinter precursor material containing metal particles is applied to selected regions of the module substrate and into the cavity. The sinter precursor material is then sintered at a maximum processing temperature less than a melt point of the metal particles to produce a sintered metal body at least partially filling the cavity and bonding the microelectronic device to the module substrate. A heatsink is bonded to the module substrate at a location thermally contacting the sintered metal body before, after, or concurrent with sintering. In embodiments, sintering may entail forming the sintered metal body to bond both the heatsink and the microelectronic device to the module substrate. The heatsink and the microelectronic device may be positioned in side-by-side relationship such that the heatsink overlies a first end portion of the sintered metal body (taken along an axis substantially orthogonal to an upper principal surface of the module substrate), while the microelectronic device overlies a second opposing end portion of the sintered metal body. In certain implementations, a metal particle-containing paste may be dispensed over and around the thermally-conductive structure to fill, at least in substantial part, one or more voids between the thermally-conductive structure and sidewalls of the module substrate defining the opening. If desired, and as previously noted, the sidewalls of the substrate may be plated with, for example, a Cu, Ag, or Au layer to promote the formation of a robust metallurgical joint at the sintered body-substrate interfaces.

In a still further embodiment, the method includes positioning a microelectronic device over a module substrate having a cavity therein. A sinter precursor material containing metal particles is applied to selected regions of the module substrate and into the cavity prior to positioning the microelectronic device over the module substrate. The sinter precursor material is then sintered at a maximum processing temperature less than a melt point of the metal particles to produce a sintered metal body at least partially filling the cavity and bonding the microelectronic device to the module substrate. A sintered ground plane is formed on the module substrate opposite the microelectronic device. The microelectronic device is electrically coupled to the ground plane through the sintered metal body.

In a yet further embodiment, the method includes positioning a thermal conduit in a cavity provided in a substrate. The thermal conduit can be, for example, a block of thermally-conductive material or a heat pipe. A sinter precursor material containing metal particles is applied into the cavity such that the sinter precursor material at least partially filling voids between substrate and the thermal conduit. The sinter precursor material is then sintered at a maximum processing temperature less than a melt point of the metal particles to produce a sintered metal body bonding the thermal conduit to the substrate. A microelectronic device and a heatsink are attached to the substrate before, after, or concurrent with sintering such that the heatsink and the microelectronic device are thermally coupled through the thermal conduit.

In still further embodiments, the above-described microelectronic module fabrication method includes the steps or processes of providing a module substrate, such as a multilayer PCB, including a cavity having metallized sidewalls. A sinter-bonded heat dissipation structure is formed within the cavity. The sintered-bonded heat dissipation structure is formed by inserting a prefabricated thermally-conductive body, such as a metallic (e.g., Cu) coin into the cavity; applying a sinter precursor material (e.g., a metal particle-containing paste) into the cavity and onto surfaces of the prefabricated thermally-conductive body before, after, or concurrent with insertion of the prefabricated thermally-conductive body; and then sintering the sinter precursor material at a maximum processing temperature to produce a sinter bond layer bonding the prefabricated thermally-conductive body to the metallized sidewalls of the module substrate.

Embodiments of a microelectronic module have also been provided. In one embodiment, the microelectronic module includes a module substrate having a cavity and a first (e.g., upper) principal surface. A sinter-bonded heat dissipation structure embedded in the module substrate and at least partially fills the cavity. A heatsink and a microelectronic device (e.g., a semiconductor die) are positioned over the sinter-bonded heat dissipation structure, as taken along an axis orthogonal to the first principal surface. The microelectronic device is thermally coupled to the heatsink through the sinter-bonded heat dissipation structure; e.g., the most direct and efficient heat transfer path from the device to the heatsink may pass through the heat dissipation structure. In certain embodiments, the sinter-bonded heat dissipation structure may include a sintered metal body bonded to the module substrate and an elongated thermal conduit, such as a heat pipe, buried in the sintered metal body. The elongated thermal conduit may have a first end portion underlying the microelectronic device, as well as a second end portion underlying the heatsink. In another embodiment wherein the module substrate includes a second (e.g., lower) principal surface opposite the first principal surface, the microelectronic module may further contain a sintered ground plane formed over the second principal surface. The microelectronic device may be electrically coupled to the sintered ground plane, possibly through the sinter-bonded heat dissipation structure.

In still other embodiments, the microelectronic module includes a module substrate having a frontside, a cavity, and cavity sidewalls defining the cavity. A microelectronic device, such as a semiconductor die, is attached to the frontside of the module substrate at a location overlying the cavity. A sinter-bonded heat dissipation structure includes: (i) a prefabricated thermally-conductive body positioned in the cavity and thermally coupled to the microelectronic device; and (ii) a sinter bond layer bonding the prefabricated thermally-conductive body to the module substrate, the sinter bond layer contacting the cavity sidewalls and an outer peripheral surface of the prefabricated thermally-conductive body. In certain embodiments, the cavity sidewalls may be covered with a metal (e.g., Cu) plating or otherwise metallized. Additionally or alternatively, the prefabricated thermally-conductive may be electrically coupled to an internal wiring layer through the sinter bond layer to, for example, provide an electrical connection between RF circuitry carried by the microelectronic component (e.g., semiconductor die) and electrical ground. Finally, in at least some embodiments, the prefabricated thermally-conductive body assumes the form of a metallic (e.g., Cu) coin having at least one plated surface, such as plated upper, lower, and possibly peripheral surfaces.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic device" is utilized in a broad sense to refer to an electronic device, element, or structure produced on a relatively small scale and amenable to packaging in the above-described manner. Microelectronic devices include, but are not limited to, integrated circuits formed on semiconductor die, MEMS devices, passive electronic microelectronic components, optical devices, and other small scale electronic devices capable of providing processing, memory, sensing, radiofrequency, optical, and actuator functionalities, to list but a few examples.

What is claimed is:

1. A method for fabricating a microelectronic module, comprising:
   providing a module substrate including a cavity having metallized sidewalls; and
   forming a sinter-bonded heat dissipation structure within the cavity, forming comprising:
      inserting a prefabricated thermally-conductive body into the cavity, the prefabricated thermally-conductive body comprising a metallic coin having a plated peripheral surface;
      applying a sinter precursor material into the cavity and onto surfaces of the prefabricated thermally-conductive body before, after, or concurrent with insertion of the prefabricated thermally-conductive body into the cavity, the sinter precursor material containing metal particles having a melt point; and
      sintering the sinter precursor material at a maximum processing temperature less than the melt point of the metal particles to produce a sinter bond layer bonding the prefabricated thermally-conductive body to the metallized sidewalls of the module substrate, the sinter bond layer contacting and extending around the plated peripheral surface of the metallic coin.

2. The method of claim 1 wherein the metallic coin comprises:
   an upper end portion;
   a lower end portion opposite the upper end portion; and
   an intermediate portion between the upper end portion and the lower end portion; and
   wherein the method comprises forming the sinter bond layer to contact an outer peripheral surface of the intermediate portion of the metallic coin.

3. The method of claim 2 further comprising positioning the metallic coin within the cavity such that lower end portion of the metallic coin is substantially coplanar with a backside surface of the module substrate.

4. The method of claim 2 wherein the metallic coin further comprises an upper plating layer formed over the upper end portion thereof.

5. The method of claim 4 further comprising:
positioning a microelectronic component over the upper plating layer after sintering the sinter precursor material; and
forming a component bond layer attaching a central portion of the microelectronic component to the upper plating layer.

6. The method of claim 1 wherein the module substrate contains an internal wiring layer; and
wherein the method further comprises forming the sinter bond layer to electrically couple the prefabricated thermally-conductive body to the internal wiring layer.

7. The method of claim 6 wherein the module substrate has a frontside in which a mouth of the cavity is formed; and
wherein the method further comprises:
positioning a microelectronic component on the module substrate at a location overlying the sinter-bonded heat dissipation structure and covering the mouth of the cavity; and
attaching the microelectronic component to the module substrate utilizing an electrically-conductive bonding material such that the microelectronic component is electrically coupled to the internal wiring layer through the electrically-conductive bonding material and through the sinter-bonded heat dissipation structure.

8. The method of claim 6 wherein the internal wiring layer comprises an electrical grounding layer.

9. The method of claim 1 wherein applying the sinter precursor material comprises applying a sinter paste containing silver particles into the cavity.

10. The method of claim 1 wherein applying comprises applying a sinter paste containing metal particles and organic components into the cavity; and
wherein sintering comprises exposing the sinter paste to elevated temperatures to thermally decompose at least a fraction of the organic components from the sinter paste during the sintering process.

11. The method of claim 1 wherein applying comprises backfilling gaps between the prefabricated thermally-conductive body and the metallized sidewalls with a sinter paste following insertion of the prefabricated thermally-conductive body into the cavity.

12. The method of claim 1 wherein the prefabricated thermally-conductive body comprises a singulated piece of a metallic sheet having at least one plated surface.

13. The method of claim 1 wherein the maximum processing temperature ranges between 170 and 300 degrees Celsius.

14. A microelectronic module, comprising:
a module substrate having a frontside, a cavity, and cavity sidewalls defining the cavity;
a metallic plating layer formed on the cavity sidewalls;
a microelectronic device containing Radio Frequency (RF) amplification circuitry, the microelectronic device attached to the frontside of the module substrate at a location overlying the cavity; and
a sinter-bonded heat dissipation structure, comprising:
a prefabricated thermally-conductive body positioned in the cavity and thermally coupled to the microelectronic device; and
a sinter bond layer bonding the prefabricated thermally-conductive body to the module substrate, the sinter bond layer contacting the cavity sidewalls and an outer peripheral surface of the prefabricated thermally-conductive body;
wherein the module substrate comprises an RF grounding layer electrically coupled to RF amplification circuitry through the prefabricated thermally-conductive body, through the metallic plating layer, and through the sinter bond layer.

15. The microelectronic module of claim 14 wherein the cavity sidewalls are metallized.

16. The microelectronic module of claim 14 wherein the prefabricated thermally-conductive body comprises a metallic coin having at least one plated surface.

17. The microelectronic module of claim 14 wherein the module substrate contains a plurality of internal wiring layers including the RF grounding layer; and
wherein, of the plurality of internal wiring layers, the RF grounding layer is located closest the microelectronic device as taken along an axis orthogonal to the frontside of the module substrate.

18. A microelectronic module, comprising:
a module substrate having a frontside, a cavity having a mouth formed in the frontside, and cavity sidewalls defining the cavity;
a microelectronic device attached to the frontside of the module substrate and covering the mouth of the cavity;
a sinter-bonded heat dissipation structure, comprising:
a prefabricated thermally-conductive body positioned in the cavity and thermally coupled to the microelectronic device; and
a sinter bond layer bonding the prefabricated thermally-conductive body to the module substrate, the sinter bond layer contacting the cavity sidewalls and an outer peripheral surface of the prefabricated thermally-conductive body; and
a component bond layer joining the microelectronic device to the module substrate and to the sinter-bonded heat dissipation structure, the component bond layer comprising:
a central portion contacting the prefabricated thermally-conductive body and the microelectronic device; and
an outer peripheral portion extending around the central portion of the sinter bond layer and around the mouth of the cavity, the outer peripheral portion of the component bond layer contacting the microelectronic device and the frontside of the module substrate.

19. The microelectronic module of claim 18 wherein the central portion is composed of a first material having a first thermal conductivity; and
wherein the outer peripheral portion is composed of a second material having a second thermal conductivity less than the first thermal conductivity.

20. The microelectronic module of claim 18 wherein the prefabricated thermally-conductive body comprises a metallic coin having an upper plated surface contacted by and bonded to the central portion of the component bond layer.

* * * * *